US009596362B1

(12) United States Patent
Smock et al.

(10) Patent No.: US 9,596,362 B1
(45) Date of Patent: Mar. 14, 2017

(54) AUTOMATED DETERMINATION OF POWER TRANSMISSION RESISTANCE

(71) Applicant: Cottonwood Creek Technologies, Inc., Centennial, CO (US)

(72) Inventors: Gary Steven Smock, Arvada, CO (US); Dwight W. Kitchin, Parker, CO (US); Alan K. Schott, Centennial, CO (US)

(73) Assignee: Cottonwood Creek Technologies, Inc., Centennial, CO (US)

( * ) Notice: Subject to any disclaimer, the term of this patent is extended or adjusted under 35 U.S.C. 154(b) by 0 days.

(21) Appl. No.: 15/166,542

(22) Filed: May 27, 2016

Related U.S. Application Data

(60) Provisional application No. 62/167,628, filed on May 28, 2015.

(51) Int. Cl.
| | |
|---|---|
| *H04M 1/24* | (2006.01) |
| *H04M 3/08* | (2006.01) |
| *H04M 3/22* | (2006.01) |
| *H04M 19/00* | (2006.01) |
| *H02J 13/00* | (2006.01) |
| *H02M 7/04* | (2006.01) |
| *H04M 3/32* | (2006.01) |
| *G01R 27/08* | (2006.01) |

(52) U.S. Cl.
CPC .......... *H04M 19/001* (2013.01); *G01R 27/08* (2013.01); *H02J 13/0003* (2013.01); *H02M 7/04* (2013.01); *H04M 3/323* (2013.01)

(58) Field of Classification Search
CPC ............ H04L 25/02; H04B 3/02; H04M 1/72; H04M 2204/14; H04M 3/08; H04M 3/24; H04M 3/305; H04M 3/005; H04M 3/30; H04M 19/005; H04M 19/001; H04M 19/08
USPC .... 379/1.01, 1.04, 12, 16, 22, 22.03, 23, 24, 379/27.01, 29.01, 29.03, 29.05, 30, 32.04, 379/394, 414
See application file for complete search history.

(56) References Cited

U.S. PATENT DOCUMENTS

| | | | | |
|---|---|---|---|---|
| 4,853,959 | A  * | 8/1989 | Johansson | H04M 19/001 379/413 |
| 6,169,785 | B1 * | 1/2001 | Okazaki | H04M 3/005 379/22 |
| 6,584,197 | B1 * | 6/2003 | Boudreaux, Jr. | H04M 19/08 363/146 |

(Continued)

*Primary Examiner* — Binh Tieu

(57) ABSTRACT

A system for optimizing the transmission of power through multiple conductors from a remote power source to a local communications device including: (a) a controller for the power source and for incrementally increasing the output voltage during a transmission resistance detection protocol; (b) a first voltage detection circuit for detecting a predetermined minimum voltage received by the detection circuit and for placing a load across the conductors when that minimum voltage is received; (c) a second voltage detection circuit for detecting a predetermined maximum voltage received by that detection circuit and for removing the load from across the conductors at that time; (d) voltage and current measuring devices to measure the transmission current and the output voltage of the power source when the predetermined maximum voltage is received; and (e) memory for storing the measured voltage, measured current and the predetermined maximum voltage for use by the controller.

20 Claims, 9 Drawing Sheets

(56) References Cited

U.S. PATENT DOCUMENTS

| | | | |
|---|---|---|---|
| 8,270,572 B2* | 9/2012 | Buskmiller | H04M 3/08 379/12 |
| 8,867,736 B2* | 10/2014 | Gaggl | H04M 19/005 379/413 |
| 2006/0078093 A1* | 4/2006 | Karam | H04L 1/22 379/24 |
| 2007/0121795 A1* | 5/2007 | Buskmiller | H04M 3/08 379/24 |
| 2009/0003587 A1* | 1/2009 | Smith | H04L 25/02 379/413 |
| 2009/0154691 A1* | 6/2009 | Gaggl | H04M 19/005 379/395.01 |
| 2012/0099724 A1* | 4/2012 | Gaggl | H04M 19/005 379/413 |

* cited by examiner

AUTOMATED DETERMINATION OF POWER TRANSMISSION RESISTANCE

PRIORITY INFORMATION

This application claims priority from U.S. Provisional Patent Application Ser. No. 62/167,628, filed May 28, 2015, the entirety of which is incorporated herein by reference.

INTRODUCTION

The ability of a finite power source to provide electrical power efficiently to a load that is located a significant distance away depends on the length of the separation. This is evident, because the resistance presented by the intervening transmission conductors increases with the distance that the power must travel to the power load. Typically, the power loss during transmission is characterized as "$I^2R$," where "I" is the current flowing in the conductors and "R" the total resistance of the conductor. With "I" being measured in amperes and "R" in ohms, the calculated power loss is provided in "watts." The total resistance "R" of the conductors can be ascertained from the resistance of the conductors per unit of length multiplied by the length of the conductors involved in the transmission.

Power losses during transmission may be reduced by increasing the voltage of the power source. This principle is employed in the electric power industry where high voltages (usually in the kilovolt range) are utilized to minimize resistance losses in long distance transmission lines. Transformers at the far end of the transmission line "step down" the voltage for local distribution and use of the electrical power. This may not be the best solution, however, in situations where the available power from the power source is limited and/or the power supplied must be rationed among multiple uses.

Thus, in many instances it is highly desirable to quantify the transmission power loss so that the available power from the power source can be used or rationed efficiently. This is particularly advantageous in multi-channel systems where the power source is employed to drive multiple loads via a number of different transmission paths. It is also quite useful in optimizing switching mode power supplies ("SMPS") that allow operation over a wide range of voltages. Optimal use of the power source may enable the source to drive more loads. It may also enable the remote power source to be positioned farther away from one or more of the loads or, stated differently, to permit the load to be positioned farther from the power source.

It is desirable to know the transmission resistance and/or the length of the transmission conductors in assessing power distribution. This is particularly useful in considering the updating, revision or improvement of an electrical system with pre-existing transmission conductors. However, the length of the power conductors is not known in many such instances and is not readily attainable. A good example of this is in the telephone industry where all or part of existing or "legacy" transmission conductors are hidden from sight. The transmission conductors may traverse considerable distances underground or through walls, ceilings and floors inside buildings or other structures. Sometimes the conductors take direct paths and at other times seemingly haphazard, circuitous and/or unknown routes. Under these circumstances it may be difficult to even estimate the length of the conductors and/or the transmission resistance. And, while it might be possible to make a "rough estimate" of the length of the transmission line, i.e., the cable or wiring, this would not take into account other unknown factors that would affect power transmission losses or resistance in the entire transmission circuit. The condition of the conductors and the existence of other electrical components in the transmission path may affect the transmission resistance. Also, it may not be practical to remove the wiring, measure it, and re-install the same or new wiring. This would be a very expensive operation especially in older buildings that do not support an infrastructure for routing modern wiring. Incarceration facilities (e.g., prisons, jails, etc.) that employ high security construction techniques such as thick concrete walls and ceilings are examples of environments where physical access to conductors is limited at best. And even temporary disruption of existing structures in such facilities could present undesirable security issues. Military, industrial, scientific and education facilities are other examples of facilities with potentially problematic legacy environments for the installation of additional or replacement electrical conductors.

Embodiments of systems and methods described herein relate to communication systems in which a remote power source is used to supply power at the necessary voltage and current to operate a local communications device. This occurs, for example, in traditional DC-powered telephone systems, such as those known in the industry as "plain old telephone service" or "POTS." In a typical POTS arrangement, DC power is supplied from a Central Office or other remote source to power a "simple" telephone at the "local" premises. FIG. 1, for example, illustrates a typical relationship between a remote power source and a local communications device in a POTS system. To optimize the remote power source it is desirable to know the resistance of the transmission wiring and any other in-line resistances or sources of power loss. For example, when this transmission resistance is known, and the power requirements of the local communications device are also known, the remote power source 1 can be adjusted to supply optimum power into the transmission circuit 2 for delivery to and consumption by the local communications device 3.

In recent times, the services provided by a simple telephone have been enhanced by one or more additional capabilities, features and devices provided by or in conjunction with the telephone. These capabilities, features and devices require power in excess of that delivered by a traditional POTS telephone network line to power a simple telephone (usually about 48 volts and 25 milliamps DC). In many instances the extra power requirements are supplied by connection to a 120-volt AC line source at the local premises via an AC/DC adaptor. In other instances—e.g., where it may be difficult, impossible or expensive to access such AC power—it would be desirable to supply "extra" DC power from a remote source such as the one that powers the simple local telephone.

Examples of such systems and methods are described and shown, for example, in U.S. Pat. No. 8,594,314 entitled "Extended Signaling System and Method," (the "'314 patent"). The '314 patent provides systems and methods by which "extra" power can be supplied from a remote power source to a local communications device having one or more additional capabilities, features and devices that require power in excess of that delivered by a traditional telephone network line. In operating such a system it is desirable to supply adequate voltage and current to the local communications device and the additional capabilities, features and devices. It is also desirable not to waste power in the form of excess voltage or current.

The optimum power to be supplied by the remote power source in such situations should take into account the power needs of the local communications device and the "resistance" of the intervening transmission circuit. The transmission circuit is sometimes referred to herein as the "transmission loop." The minimum voltage and current that should be supplied by the remote power source is governed by the power requirements of the local communications device. But that does not take into account resistance added by the loop connecting the remote power source and the local communications device and the resistance of any other components, e.g., overload protection devices, connected in that line or other transmission losses (collectively referred to herein as the "transmission resistance"). As mentioned previously, in many situations the transmission resistance is not known with certainty or capable of being readily ascertained.

Thus, it would be desirable to be able to determine the total transmission resistance quickly, efficiently and precisely.

Hypothetical procedures that might be employed to evaluate transmission line resistance would typically require technicians stationed at both the remote location and the local premises to deploy, operate, and monitor mechanical switching devices or other testing equipment. The technicians would also need to communicate with one another as they initiate and implement the test process. Such a testing protocol would not be efficient either in terms of time consumed or cost incurred. And while such a protocol might be employed on special occasions, it would not be practical to use such a protocol on the numerous occasions (e.g., system start-up, re-booting, etc.) when an evaluation of the transmission resistance is needed or desired.

Ideally a method and system could be devised that would evaluate or determine the actual resistance in a transmission circuit taking into account the resistance supplied both by the conductors and other components in the loop, the condition of the conductors and components, and other transmission power losses. Even more ideally, such a system and method should be automated and could be employed quickly whenever desired. Such a method and system would not require a technician at either end of the transmission circuit and would not require communication (e.g. data transmission) electronically or otherwise between the remote and local environments. The method and system could be employed whenever initiated by a particular protocol including, for example, initiation by the remote power source upon start-up. Finally, the system should not add significantly to load resistance or other losses when the transmission loop is in normal use to power a local load.

It is with respect to these and other considerations that embodiments of the technology are described in this application. Although certain problems have been discussed, it should be understood these or other embodiments should not be limited to solving the specific problems identified in the foregoing introduction.

SUMMARY

The technology, including, for example, systems and methods described herein, provide methods and systems for detecting the resistance associated with a power transmission circuit connecting a remote power source and a local electrical load such as a "communications device." The systems and methods could be employed, for example, to determine the resistance of the transmission circuit in FIG. 1 including, without limitation, conductors 2 connecting the remote power source 1 with the local communications equipment 3.

In accordance with certain embodiments, a transmission resistance detection ("TRD") module (e.g., circuit) is located in, at or near the local communications device 3. It may be activated by conditions at that device and/or at the remote power source 1. The transmission resistance detection equipment and associated current and voltage measuring devices provide data from which the transmission resistance can be computed or otherwise evaluated. This transmission resistance ("TR") includes all resistance in the transmission of electricity from the power source 1 to the point at which the detection equipment is attached to the transmission conductors. This includes the resistance of the conductors and other electronic components in the transmission circuit and takes into account the condition of the conductors and components and any other power losses in the transmission circuit. With the TR information, optimal power (voltage and current) can be supplied by the remote power source to effectively and efficiently operate the local communications device.

In one embodiment, the TRD circuit responds to a series of increasing voltages supplied by the remote power source under the direction of a power source controller. Information regarding: (a) the output voltage of the remote power source; (b) the corresponding voltage received by the TRD circuit; and (c) the corresponding current flowing in the transmission circuit provide transmission resistance data ("TR data") from which the controller can calculate or infer the transmission resistance. The controller takes the TR data and uses it to adjust the output voltage of the power supply as appropriate for the transmission resistance and the needs of the local communications device. This can be done, for example, by directly computing the transmission resistance from the voltage drop across the transmission loop and the current flowing through that loop. Or it can calculate the transmission line length if the resistance per unit length of the conduit is known. Or the controller can utilize the TR data via a "look-up" table or other similar means to ascertain the appropriate output voltage from the remote power supply without directly calculating the transmission resistance.

Embodiments of the systems and methods described herein can be used, for example, in connection with a remote, adjustable voltage output switching power supply ("SMPS"), whose operation is controlled by an intelligent logic controller with appropriate programming and memory to control the operation and output of the SMPS. At an appropriate time, e.g., as the SMPS "starts up," the controller initiates a protocol for the transmission resistance determination ("TRD"). Over a relatively brief period of time, the TRD protocol increases the output voltage of the SMPS in a series of discreet "step-ups." The voltage is transmitted by the power transmission loop to the local premises. A TRD module located in, at or near a local communications device reacts to incoming voltages at the point of connection. When the voltage received by the TRD circuit reaches a pre-determined (or pre-set) minimum, the circuit automatically connects (e.g., closes a switch resulting in) a known power load across the transmission wires. A current measuring device monitors the current in the transmission loop. In one embodiment the current detection equipment is located at the remote premises near the SMPS and controller. After each current measurement, the voltage at the power source is incrementally increased and the current measured again. That current is compared against the current measured with respect to the preceding, lower voltage. That process is continued until the voltage received by the TRD module from the remote power source reaches a pre-determined (or pre-set) upper threshold ("maximum") voltage. This results in the opening of the switch and the removal of the load from across the transmission lines. Contemporaneously, the current measuring system detects a large drop in the current from the previous current measurement. This defines an "inflection point" at which the controller knows the following TR data: (a) the output voltage of the remote power source; (b) the corresponding voltage received by the TRD circuit (e.g., the pre-determined maximum voltage); and (c) the corresponding current flowing in the transmission circuit immediately prior to the inflection point. By subtracting the inflection point voltage at the local TRD circuit from the corresponding output voltage of the remote power supply, the voltage drop across the transmission circuit can be determined. That information can then be used along with the current measured in the transmission circuit at the inflection point to determine the transmission resistance. The resistance is used to set the optimum voltage of the remote power supply.

In an embodiment, the TRD module includes a switch that can be opened and closed in response to events indicating the voltage received by the TRD circuit from the remote power source. When the switch is closed, it connects a known load across the transmission conductors. That load is removed when the switch is opened. In one embodiment, the TRD module includes a minimum voltage level detection circuit that can identify a pre-determined (or pre-set) lower threshold ("minimum") voltage received from the remote power source. When the TRD module recognizes receipt of the minimum voltage, the load is applied across the transmission conductors. The TRD module also includes a maximum voltage level detection circuit that recognizes when a certain pre-determined higher voltage is received from the remote power source. This results in the opening of the circuit thereby defining an "inflection point." A current measuring device measures the current flowing through the transmission conductors from the time the switch is closed to the time it is opened at the inflection point. Similarly, a voltage monitoring device measures the output voltage of the remote power source during this time period.

A TRD module can be employed with other components to provide a TRD control system to regulate the output of a remote power supply. One embodiment of such a system for evaluating the resistance associated with the transmission of power through multiple transmission conductors from a remote power source to a local communications device can include:

a controller for controlling the voltage output of the remote power source and for incrementally increasing the voltage output of the remote power source during a transmission resistance detection protocol and thereafter for taking transmission resistance data obtained during the protocol and using at least a portion of the data to control the output of the remote power source thereafter;

a transmission resistance detection module attached to the transmission conductors at or near the local communications device comprising:

a first voltage detection circuit for detecting a preset minimum voltage received by the detection circuit and for placing a known load across the transmission conductors when the minimum voltage has been received; and a second voltage detection circuit for detecting a preset maximum voltage received by the detection current and for removing the known load from across the transmission conductors when the maximum voltage has been received;

a current measuring device to measure the current flowing in the transmission conductors when the known load has been placed across the transmission conductors; and memory associated with the controller to store, among other things, transmission resistance data for use by the controller in establishing an operational voltage of the remote power source, such transmission resistance data comprising: (a) the pre-determined maximum voltage to be received by the transmission resistance detection module; (b) the output voltage of the remote power source corresponding to the pre-determined maximum voltage when received by the transmission detection module; and (c) the current flowing through the transmission conductors when the pre-determined maximum voltage is received by the transmission resistance detection module.

As will be evident from the foregoing and from the description and drawings herein, embodiments of the transmission resistance detection methods and circuits have a number of advantages. Among other things, the detection methods and circuits assess all the resistance of the power transmission circuit from the remote power supply to the TRD module, including both the power transmission cable, components attached to that cable, and losses resulting from the condition of the transmission cable or other sources. In many instances the additional losses will be relatively small compared to the resistance of the transmission cables. Nevertheless, it is useful to have an accurate assessment of all losses. The detection methods and circuits perform the detection quickly, e.g., in a matter of seconds and accurately, e.g., within about 5%. The TRD circuit hardware can be positioned at one, e.g., the local, end of the power transmission circuit. In embodiments, the TRD circuit does not require any communication with the remote power supply other than the receipt of power over the power transmission circuit. The TRD methods and circuits rely on electronic switching and computation. The detection circuit is automated and does not require mechanical switching or other human interaction, e.g., it can operate unattended. The detection circuit uses a minimum amount of power so that it does not drain precious power resources intended for the local telecommunications device during the operation of that device. The detection circuit is inexpensive to build and to operate. The detection methods and circuits can be deployed in association with each channel of a multi-channel power transmission system so that the power presented to each channel is optimized.

The foregoing "summary" is not intended to be comprehensive and is not intended to identify "key" or essential features of the invention. The summary is provided only to introduce and to generally describe some of the aspects of embodiments which are described more fully in the entirety of the written description and drawings in this application. Accordingly, the summary should not be used to narrow the scope of the invention.

BRIEF DESCRIPTION OF THE DRAWINGS

Non-limiting and non-exhaustive embodiments are illustrated with reference to the following drawings.

The accompanying drawings are intended to illustrate certain relationships regarding aspects of the technology. The drawings are not intended to be exhaustive of all aspects of any embodiment or to illustrate all possible embodiments of the present invention. Note that like items in multiple drawings may have like reference numbers.

DETAILED DESCRIPTION

The technology may be further understood with reference to the following description and sample embodiments.

Certain aspects of the technology will now be described with respect to FIGS. 1, 2 and 3 which illustrate the utility of the present technology and the architecture of certain embodiments.

Figure 1:
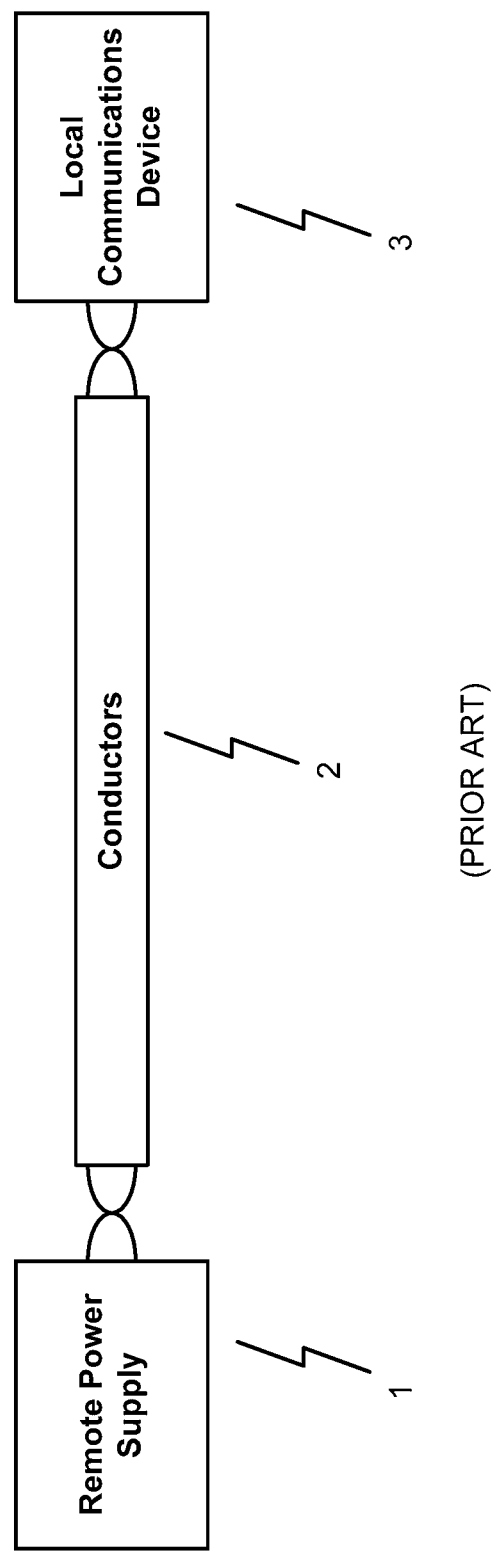
FIG. 1 is a simple block diagram illustrating the transmission of power from a remote power source to a local communications device. The drawing depicts prior art.

FIG. 1 is a simple block diagram that depicts the deployment of a remote power supply 1 that provides sufficient voltage and current via multiple conductors 2 to power a local communications device 3. In one embodiment, the conductors 2 comprise a pair of conductors capable of carrying the required power to the local communications device.

In reference to FIG. 1 and for purposes of understanding aspects of the present technology, the following terms should be understood in context:

"Local" refers to the physical location of the communications device receiving power from a remote source. In a POTS system "local" is sometimes used in reference to the "customer premises" or the "subscriber premises." In one sense, these terms might be applied to a building or other structure in which the communications device is housed. As used herein, however, the term "local" is generally used more narrowly to refer to the area surrounding or near the local communications device. The concept of "local" is meant to distinguish the location of the communications device from a "remote" location some distance away where the power source is located. In some instances the power source and the communications device could be in the same large building or a "campus" of buildings, but separated by hundreds or thousands of feet.

"Local communications device" refers in general to an electrical "load," for example, a simple telephone. It may also include additional or enhanced capabilities, features and devices such as those mentioned or alluded to in the '314 patent. For example, "local communications device" could include speaker phones, non-telephone, yet telephone like instruments, such as a video phone or non-telephone like devices that may optionally include telephone communications features such as a computer or microcontroller based display and user interface device primarily intended to access data or inmate related services. In some settings, the "local communications device" may also include devices or methodologies for identifying a user, such as fingerprint, voiceprint, or retinal scan. Speech recognition devices and methods may also be employed to enhance the communications device. Frequently, these provide capabilities, features and devices requiring power in excess of that historically supplied by POTS to a simple telephone (e.g. approximately 48 volts and 25 milliamps DC). Some of these communications devices may traditionally be AC line powered devices.

"Remote" refers to a location distant from the local communications device. Generally, it is used herein to distinguish the location of a remote power source from the location of a local communications device. For example, the remote power source may be located in the Central Office; within a "Remote Terminal" or a "Subscriber Loop Carrier" installation; from a "Channel Bank" which may be located within the subscribers' premises or a nearby building or in a "Controlled Environment Vault" near the subscribers' location. "Remote" could also include the service entrance of the network into the building or at an appropriate distribution frame. "Remote" could also include some area employed for the provisioning of, for example, communications features and/or services separate from features and/or services generally associated with traditional telecommunications infrastructure and centralized systems.

"Remote power source" refers to a power source at a remote location and can include, for example, an AC line powered supply, a battery, other DC power sources, or a combination of these configured to supply DC voltage to a transmission line for the delivery of power to a local communications device.

"conductor or conductors" refers to any electrical conductor used to transmit power from a remote power source to a local communications device. Some embodiments are particularly applicable to "twisted-pair" cable or other multiple twisted pairs of conductors such as a CAT5 cable. The term "twisted-pair" includes, for example, 24AWG twisted-pair copper wiring and cables that are common in telephony applications. The foregoing is not meant to preclude the use of, for example, coaxial or other appropriate cable arrangements. The conductor(s) may also be employed to transmit non-power signals such as communications and data signals.

"transmission circuit" or "transmission loop" includes the conductors and other electrical components through which power passes from the remote power source to the local communications device.

"transmission resistance" or "TR" includes the resistance of conductors and other components in the transmission circuit from the remote power source to the point where the resistance is to be determined in accordance with embodiments of the technology. If the transmission resistance detection equipment resides in the local communications device, then this resistance should include everything in the transmission loop from the power source to the local communications device. If the detection equipment is not located at or near the local communications device, then the transmission resistance may not include any remaining conduit, e.g., "last inch" cable, conductors, connectors, or components between the detection device and the local communications device. In such instances the combined resistances of the "last inch" conductors, etc., would typically be pre-determined either to be inconsequential as compared to the overall resistance of the transmission loop or to be of a known resistance which the remote power source controller may readily include (as a pre-set constant or otherwise) within the total resistance determination.

"transmission resistance detection" or "TRD" refers to the process by which information or data is obtained about the transmission circuit so that: (a) the information or data can be employed to calculate the transmission resistance or (b) the information or data can be employed to calculate the length of the transmission conductors or (c) the information or data can be employed as input to a "look up" table or other rule(s) (e.g. "hierarchies") whose output reflects (but does not quantify) the transmission resistance or line length and indicates a desired voltage setting or range of voltage settings for the output of the remote power supply.

Figure 2:
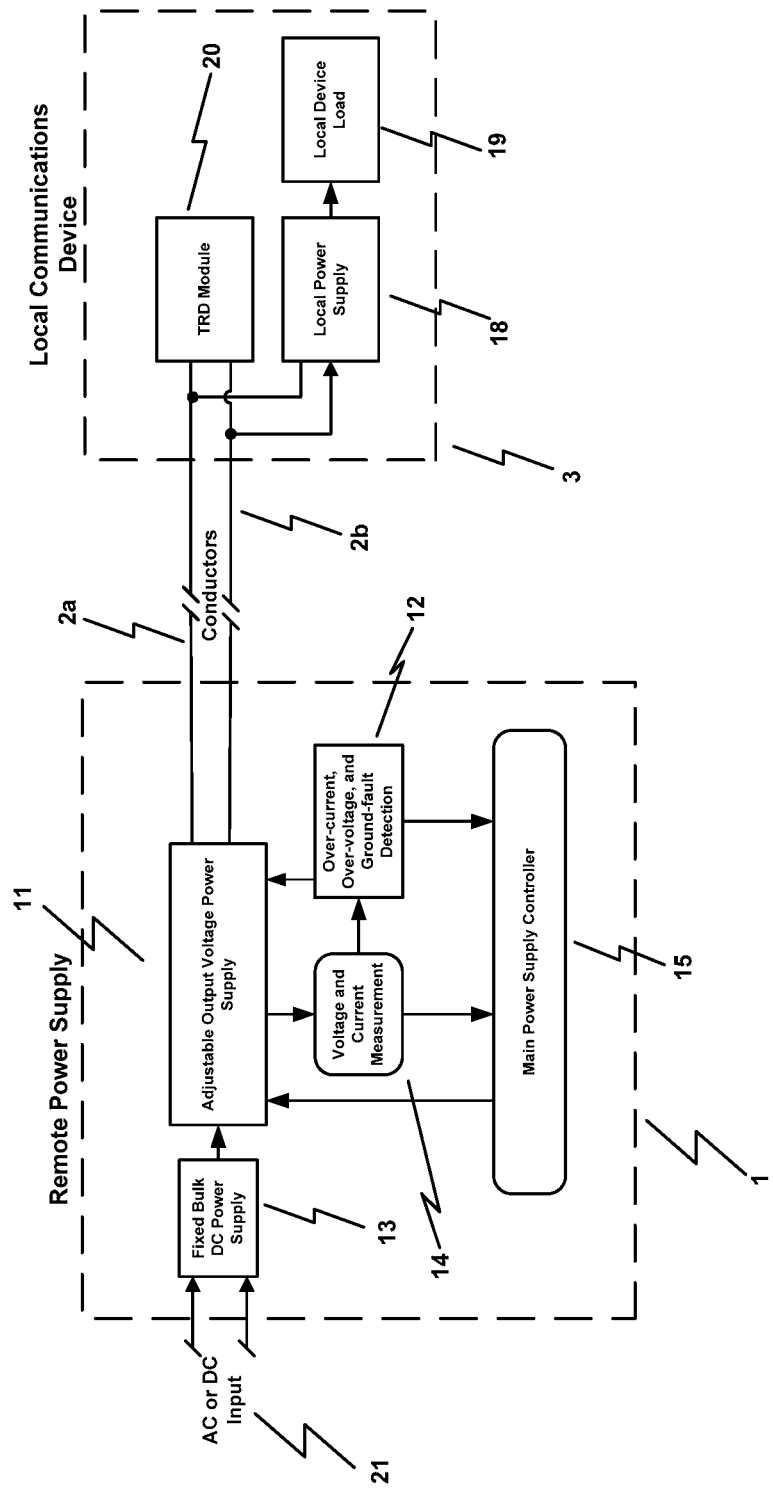
FIG. 2 is a block diagram depicting one arrangement of functional components in accordance with an embodiment of the present technology in a power transmission system such as that shown very generally in FIG. 1.

FIG. 2 is a block diagram depicting one arrangement of functional components within the remote power supply 1 and the local communications device 3 in accordance with an embodiment of the present technology. In the embodiment depicted, the remote power supply 1 comprises a bulk DC power supply 13 having an AC or DC input 21 and being capable of providing enough voltage and current to adequately power the local communications device at peak loads. The bulk power supply feeds an adjustable output voltage stage 11 that allows control of the output voltage, e.g., from zero volts to the maximum desired operating voltage or some other more limited range of voltages. The power supply includes main controller 15, including a processor, logic and memory, to provide general control over the operation of the adjustable power supply 11. The processor logic also includes a TRD protocol or mode for initiating the acquisition of TR data and for using that data to adjust the output of the power supply. The output voltage of the power supply and the current in the power transmission loop (e.g., 2a and 2b) are monitored by measurement module 14.

In one example, the bulk DC power supply 13 has an AC input 21 of 120V AC, and an output voltage of 210V DC. The bulk DC power supply 13 feeds power to the input of the adjustable output voltage switching power supply 11 that provides a variable output that is controlled by the main controller 15. The output voltage amplitude is dependent on the load requirements of the local communications device 19 and the resistance involved in transmitting that power to the local communications device. As mentioned previously, that transmission resistance includes the length of the conductors 2a and 2b, additional components in the transmission circuit, and other factors (e.g., poor condition of the cable or its shielding) that result in "leakage" and added resistance. Embodiments of the present invention are intended to determine that transmission resistance so that the voltage of the adjustable output power supply can be set optimally to overcome the transmission resistance and meet the power needs of the local device.

Voltage and current measurements are accomplished by module 14, for example by using analog-to-digital converters that are coupled to the conductors and provide a digital representation of the associated voltage and current values to the main control logic. The voltage and current detection could be achieved using other means commonly known to one of ordinary skill in the art. In an embodiment, the voltage and current measuring devices are always active and can be read whenever necessary to determine status. Among other things, module 14 is useful in providing information to monitor the performance of the variable output voltage power source and the transmission circuit during operation of the power supply. As described later, however, module 14 is particularly useful in obtaining information comprising TR data, e.g., the output voltage of the remote power supply and the current in the transmission circuit, both as associated with the TRD inflection point. In one embodiment, the voltage and current measuring devices are continuously read during the process of obtaining TR data and also during normal operation.

The remote power supply depicted in FIG. 2 also includes hardware circuit 12 that provides safety and equipment protection. For example, module 12 can include over-current, over-voltage, and ground fault "detectors" that react to any condition in the circuitry that may pose a personal safety issue or a threat of damage to components in the remote power supply 1 and/or the local communications device 3. Module 12 may include a variety of circuits and devices for reacting to over-current, over-voltage, and ground fault conditions known to one skilled in the art such as voltage comparators, reference voltages, current to voltage amplifiers, scaling amplifiers (in the case of general detection circuitry functions) and relays or transistors to disconnect the conductors (in the case of fault conditions). In the embodiment depicted in FIG. 2, module 12 is associated with module 14 and may receive current and/or voltage information from module 14. Module 12 is not a necessary part of the process of obtaining TR data. In some embodiments of systems and methods of the technology, however, information from that module may be employed to "check" whether there is any condition in the circuitry that might adversely affect the circuits in general, the TRD protocol (described later), the TRD module 20 and/or the TR data. Error signals generated by module 12 can also result in disconnection of circuits in general, and/or termination of any process related to the TRD protocol and/or the TRD module.

The main controller 15 consists of a microprocessor with associated volatile and non-volatile memory and input/output interfaces that are compatible with the digital interfaces in the adjustable output voltage power supply 11.

FIG. 2 also depicts the local communications device 3 comprising three main components including: (a) a TRD module 20 used to detect and react to certain electrical events (e.g., the receipt of predetermined minimum and/or maximum voltages) at the TRD module resulting in the collection of data relating to the transmission resistance in the transmission circuit connecting the local communications device to the remote power supply; (2) a local power supply 18 that can produce and regulate sufficient power to operate the local device load 19 within its operating parameters; and (3) a local device load 19 that consumes the power transmitted from the remote power supply for operation of the local communications device. The inclusion of the TRD module 20 as part of the local communications device is somewhat arbitrary. It is shown that way in FIG. 2 because, as noted elsewhere herein, it may be desirable to locate the TRD module very close to the local power supply 18 and the local device load 19. In some instances, all three components 18, 19 and 20 will be contained in a single physical housing. One skilled in the art, however, would appreciate that reference herein to "local communications device" always includes the load 19, and usually includes the local power supply 18, and optionally the TRD module 20, depending on the arrangement of these components in a particular embodiment. For example, in an alternative embodiment, the TRD module 20 is a separate and standalone device adapted to be co-installed with generic local communications devices.

FIG. 2 also depicts that the conductors employed in connecting the remote power supply 1 and the local communications device 3 comprise at least two conductors 2*a* and 2*b*, one with a voltage potential and polarity that is more positive, e.g., 2*a*, than the other 2*b*.

As described more fully below in conjunction with FIGS. 4, 5 and 6, the functional units of embodiments depicted in FIG. 2 generally cooperate as follows. A typical operational sequence begins as the remote power supply 1 "starts up" operation, e.g., is "booted." Main controller 15 proceeds to initiate a protocol mode to determine the transmission resistance between the remote power supply and the local communications device. The processor evaluates the transmission resistance by, among other things: (a) directing the adjustable power supply 11 to make incremental "step-up's" in the output voltage so that detection module 20 can respond to the corresponding voltage "step-up's" received at the local device to "open" and "close" a circuit placing a load across the transmission wires and (b) receiving information from voltage and current detection module 14 to monitor and continue that process until completed. As mentioned previously and explained in more detail hereafter, this results in the determination of transmission resistance data, i.e., an output voltage of the remote power supply, a corresponding voltage received by the TRD module and a corresponding current flowing in the transmission circuit. After processing the TR data, main controller 15 will automatically adjust the output voltage of adjustable power supply 11 so that it is at a level necessary to support the transmission resistance and the local device load. When the optimal operating voltage level has been signaled by the processor to the SMPS, that voltage is transmitted via the transmission circuit. Enough power will be received so that the local communications device's switching power supply will start, and the local device will begin operation.

As noted previously, one of the advantages of embodiments of the technology is that it is not necessary for the controller 15 to receive data (e.g., voltage and current) directly from the TRD module 20 during the TRD protocol. Module 20 reacts to the voltage received from the remote power source and does not need to receive other data from the controller. The controller monitors data received from the voltage and current measurement module 14. Thus, there need not be a separate communication channel for data between the controller 15 and the TRD module 20.

The TRD module remains active during routine operation of the remote power supply, transmission loop and the local communications device 19. However, the load 85 (FIG. 8) is no longer applied, and the remainder of the TRD module presents relatively minimal load resistance to the remote power supply. In fact, as shown in embodiments herein, the TRD module is connected in parallel to the flow of current to the local communications device. In any event, the resistance of the TRD module is included in the TR data, and is taken into account when the controller 15 adjusts the output voltage of adjustable power supply 11.

Figure 3:
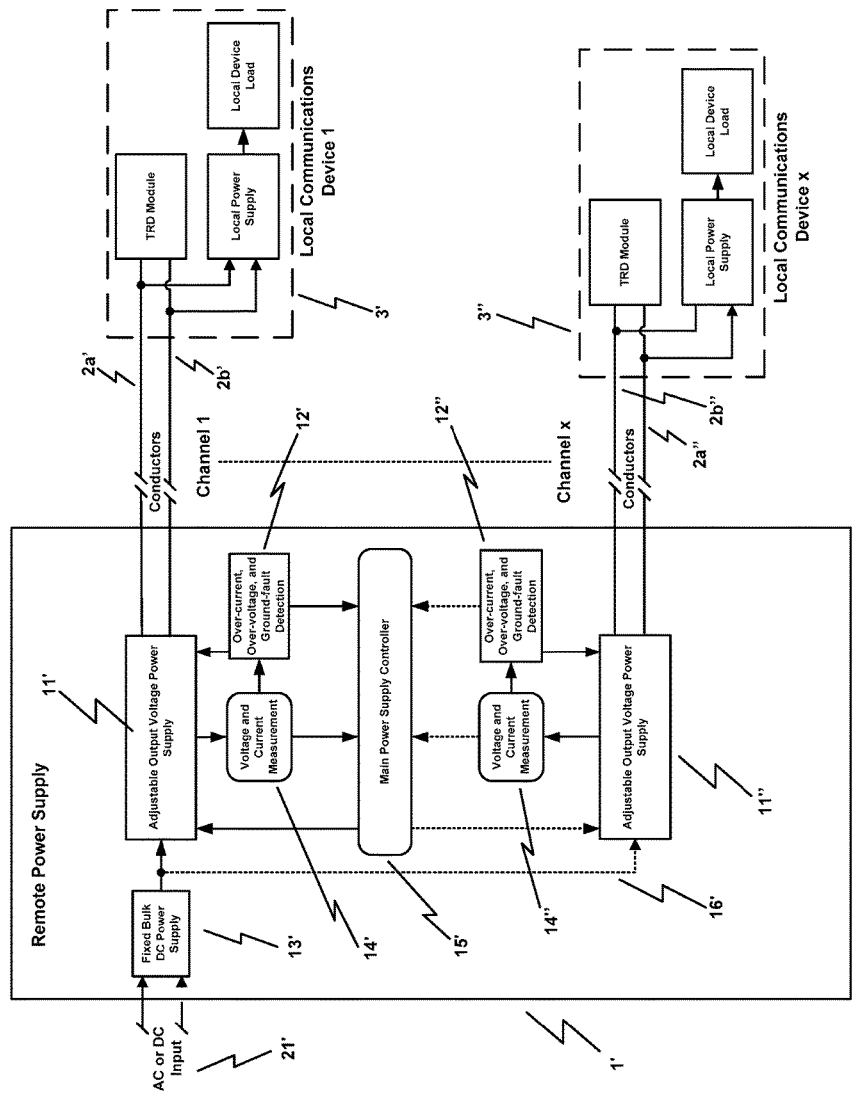
FIG. 3 is a block diagram showing functional components and their relationships in an embodiment similar to that depicted in FIG. 2, albeit in a multi-channel architecture.

FIG. 3 illustrates a multi-channel architecture for an embodiment of the system and method that allows more than one local communications device, e.g., 3' (i.e., channel 1) and 3" (i.e., channel "x"), to be powered by the remote power supply 1'. The channels all share fixed bulk DC power supply 13' and main controller 15'. The remote power supply 1' utilizes a single bulk power supply 13' that receives input power, e.g., AC, from source 21'. The DC power from the bulk power supply 13' is distributed by a bus 16' to each of the channel's adjustable output power supplies 11' and 11". Each individual channel has its own voltage and current measurement monitors 14' and 14". Each channel also has its own over-current, over-voltage, and ground-fault "detectors" 12' and 12". The main controller 15' can be used to control each of the adjustable output voltage supplies, e.g., 11' and 11". More channels can be controlled by a single controller depending upon specific application requirements of the main control logic processor.

Each channel has its own transmission circuit, for example, conductors 2*a'* and 2*b'* in one channel and 2*a"* and 2*b"* in channel "x". In the scenario depicted, each of the local communications devices 3' and 3" is configured the same as in the single channel architecture depicted in FIG. 2. Each one has a local device load 19' and 19" with a local power supply 18' and 18" and a TRD module 20' and 20". Alternatively, TRD modules 20' and 20" may be near, but not within the respective housings of the local communications devices 3' and 3".

Regardless of whether the device load in each of the local communications devices 3' and 3" has the same or different power requirements, the fact that each device is connected to the remote power source 1' by a different transmission channel (e.g., 2*a'* and 2*b'* for channel "1" and 2*a"* and 2*b"* for channel "x") means that the transmission resistance may be different for each channel. Because those differences (e.g., potential differences in the local load requirements and the transmission resistance for each channel) can be significant, it is desirable to be able to compensate with appropriate output voltages for each of the adjustable output voltage power supplies, e.g., 11' and 11". The multi-channel embodiment illustrated in FIG. 3 is one way of achieving that result insofar as it permits adjustment of the operating voltage for differences in the transmission resistance in each channel. In addition to the fact that the hardware in each channel may be the same, each channel may operate under the same TRD protocol. This can be performed simultaneously or individually.

Figure 4:
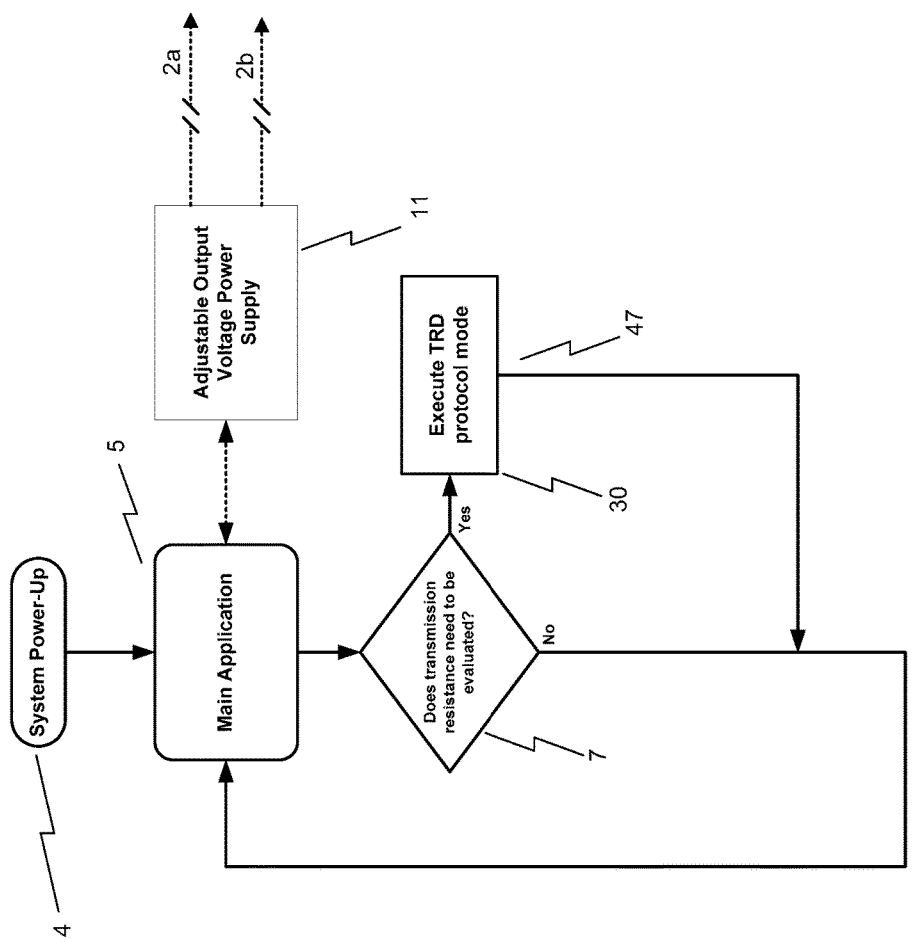
FIG. 4 is a flowchart depicting certain features of one embodiment of program logic employed by a device for controlling the operation of a variable voltage remote power supply including provision for "calling" and executing a TRD protocol mode for transmission resistance detection.
Figure 5:
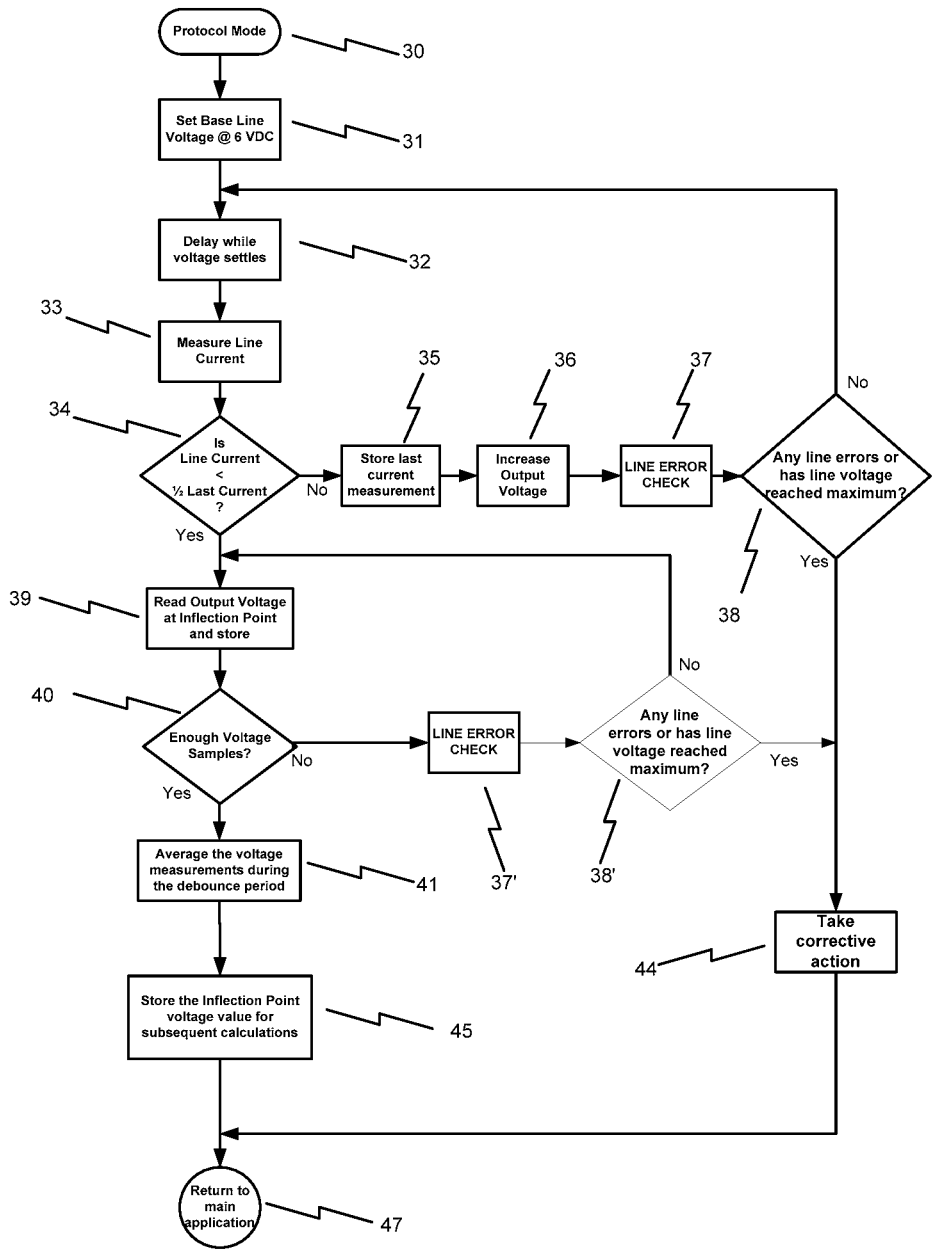
FIG. 5 is a flowchart depicting some features of an embodiment of a protocol mode, such as that called for and executed by the program logic of FIG. 4, and used in a method for transmission resistance detection in one embodiment of the present technology.
Figure 6:
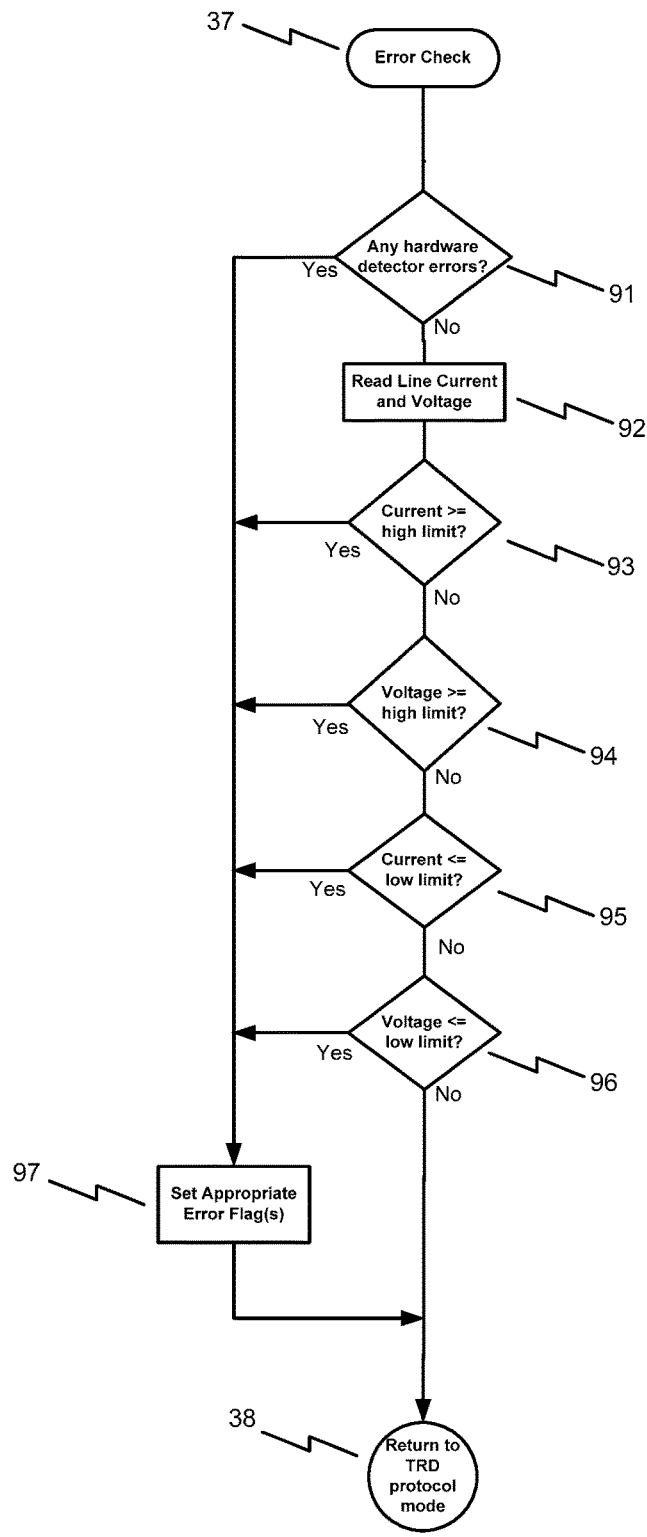
FIG. 6 is a flowchart depicting some features of an error checking subroutine that may be "called" from a TRD protocol mode, such as that illustrated in FIG. 5, and employed to assure proper functioning of the TRD protocol in accordance with one embodiment of the present technology.

Embodiments of TRD methods in accordance with the technology are now described in more detail with respect to FIGS. 4, 5 and 6.

FIG. 4 is a flowchart depicting logic that is utilized by the main controller 15 that regulates the remote, adjustable power supply 1 in a system such as that depicted in FIG. 2.

The main application 5 begins with power-up 4 of the remote, adjustable power supply 11 and runs continuously whenever that power supply is operating. The main application 5 periodically checks 7 to determine if a transmission resistance evaluation "TRD" is required. Generally, a TRD is always requested and performed prior to applying the output power of the remote power supply to the load 19 in local communications device 3. However, it may not be necessary to call the TRD protocol every time the system is started-up. Assuming that no changes have been made to the transmission loop, stored TR data from prior execution of the TRD protocol could be used for subsequent power-up(s). Nevertheless, the main application 5 should perform a quick current check to make sure that a load 19 is connected before the application 5 steps-up the output voltage of power supply 11 to the final amplitude pre-set from the prior TR data.

If the main application 5 requests a TRD evaluation, the main application executes a protocol 30 which stays active until the transmission resistance evaluation has been completed, e.g., the TR data has been collected at the "inflection point" or the TRD evaluation has been terminated for another reason. The TR data is then sent to the main application 5 which utilizes that information to provide voltage-setting information to the adjustable output power supply 11. The power supply then provides that power to conductors 2a and 2b to power the local communications device. In an embodiment, the entire process from the initiation of the protocol, through processing and adjustment of the voltage at the remote power supply takes a matter of seconds. In embodiments described herein, the process takes less than one minute and usually less than 30 seconds.

During operation of the power supply 1, the main application 5 continues to check at 7 to determine whether the TRD protocol should be initiated again. Typically, this might occur when the power-supply needs to be re-booted, due to a system restart or the restart of a specific channel occurs in a multi-channel configuration, such as illustrated in FIG. 3. In addition, there may be an over-ride circuit to manually start the TRD protocol 30 when desired, for example, due to changes to or other conditions affecting the transmission circuit. The over-ride could also permit an operator to stop the TRD process after it has been initiated, but before it has been completed. In any or all circumstances there may be a visual display showing relevant information, such as, the status of the TRD protocol, all or portions of the TR data obtained by the protocol, etc. For example, there may be front panel status indicators to indicate the operational mode of the system, including whether the TRD protocol mode is currently active and/or information regarding when a TRD protocol 30 was last performed and whether or not it was performed successfully. Visual displays may show the output voltage set for the remote power supply 11 by the logic 5 and controller 15 using the TR data and the actual output of the remote power supply as measured, for example, by module 14.

FIG. 5 is a flowchart depicting features of the TRD protocol logic 30 in one embodiment of the present invention. The TRD protocol is initiated when the main controller logic 15 temporarily moves from its normal operational mode 5 to TRD protocol mode 30. In general, the TRD protocol 30 orchestrates the supplying of current at sequentially higher voltages from the adjustable power supply 11 to the TRD module 20 at the local premises, the performing of the TRD evaluation and the collecting of TR data. The result of the TRD evaluation (e.g., the TR data indicative of the electrical resistance presented by the transmission loop) is then sent to the main application which, as previously noted, processes that data and sends voltage setting information to adjustable output power supply 11 so that it can provide the appropriate power to conductors 2a and 2b to power the local device load 19. For purposes of illustration, the protocol 30 is described with reference to the hardware architecture depicted functionally in FIG. 2.

As indicated in FIG. 5, the TRD protocol at 31 causes the adjustable output power supply 11 to provide an appropriate "base" or initial voltage ("$V_{remote/initial}$") to the conductors 2a and 2b. $V_{remote/initial}$ is a pre-determined low voltage, for example 6V DC. The TRD protocol then provides a delay period 32 to allow the newly-set output voltage level of the adjustable power supply 11 to "settle" to a steady state. In one embodiment this delay is more than 5 ms but probably not more than 5 seconds.

Following the delay 32, the protocol at 33 notes and records the measurement of electrical current then flowing through the transmission circuit. The current reading is supplied by the voltage and current measurement module 14 (FIG. 2). Technically, a load has not yet been placed across the transmission conduits 2a and 2b. However, as one skilled in the art would appreciate, there is always the flow of some small amount of current over these conductors in a POTS arrangement. This is true even before the TRD module has placed a temporary load in the transmission loop. Thus, the initial current $I_{initial}$ corresponding to $V_{remote/initial}$ will be weak, and the current measurement will be small. $V_{remote/initial}$ is selected at a safe amplitude that is in a range that can be easily regulated to ensure voltage stability.

In response to $V_{remote/initial}$, a small amount of electrical power will be received by the TRD module 20 located in the local communications device 3 (FIG. 2). The voltage first received at the local TRD module corresponding to $V_{remote/initial}$ is less than $V_{remote/initial}$ due to the yet-unquantified transmission losses. This initial voltage received at the TRD module is denoted herein as "$V_{local/initial}$" which is measured by the protocol 30 after the voltage settles. As described later with respect to FIGS. 8 and 9, the TRD module determines whether $V_{local/initial}$ meets a certain predetermined minimum voltage $V_{local/min}$, for example, 9.2V DC. If $V_{local/initial}$ meets or exceeds $V_{local/min}$, a switch is closed thereby placing a load across conductors 2a and 2b thereby establishing a much stronger current through those conductors than $I_{initial}$. (See FIG. 8 and the associated description of the TRD module 20.) In the embodiment depicted in FIGS. 8 and 9 the detection of whether $V_{local/initial}$ meets $V_{local/min}$ and the deployment of the load all occur as the result of a hard wired circuit without the intervention of TRD protocol 30 or any other computer processing intelligence. Simply stated, the circuits in TRD module 20, such as the minimum voltage detector 82 (FIGS. 8 and 9), automatically "react" to the incoming voltage received from time-to-time.

Regardless of whether $V_{local/initial}$ meets $V_{local/min}$, protocol 30 steps up the output from the remote power supply 1 to an incrementally higher level $V_{remote/n}$. This occurs at decision point 34 in protocol 30 as it compares the initial current reading $I_{initial}$ (taken by voltage and current measuring module 14) against the previous current reading to determine whether it is significantly less than the prior reading. If it is not significantly less (e.g., 50% less) than the previous reading, the protocol 30 proceeds to step-up the output voltage of remote power supply 1. Because there was no current measurement prior to $I_{initial}$, the initial decision at 34 is "no," and the output voltage is increased to $V_{remote/n}$. If $V_{local/initial}$ did not meet $V_{local/min}$, the TRD circuit 20 then determines whether the corresponding new voltage it receives, i.e., $V_{local/n}$, meets $V_{local/min}$. If $V_{local/n}$ does not meet or exceed $V_{local/min}$, the condition of decision point 34 will continue to be negative, and the process of incrementally increasing the output voltage of the remote power source 11 will be repeated until $V_{local/n}$ meets $V_{local/min}$. At that time, a switch is closed, thus placing a load across the transmission conductors 2a and 2b thereby establishing a much stronger current through those conductors than $I_{initial}$. (See FIG. 8 and the associated description of the TRD circuit.)

Regardless of when $V_{local/min}$ is reached and a load is placed across the transmission conductors 2a and 2b, the connection of the test load into the transmission circuit constitutes a first event useful in the collection of TR data. It establishes a sufficiently strong current path through the transmission circuit that can be monitored for the next event, i.e., a current "inflection point," as described below. The inflection point is detected by comparison 34 in protocol mode 30.

So long as there is no significant drop in back-to-back current readings at 34 (i.e., the inflection point has not been reached), the protocol 30 stores the most recent current measurement at 35 and proceeds to increase the output voltage of the remote power source 11 by the next increment, for example 600 mV, at 36. At that time the protocol may also perform certain checks to determine if there are irregularities in the transmission loop and associated devices. These checks are not required for ascertaining TR data, but assist in determining whether the TRD protocol is running normally and there is proper operation of the remote power source 1 in general. For example, line error check 37 may query module 12 (FIG. 2) for problems perceived by the over-current, over-voltage and ground fault detectors and may receive information from module 14 that can indicate irregularities in the circuit or the protocol. Among other things, the protocol checks to see whether the output voltage of the remote power source exceeds a pre-set maximum, e.g., 21.0V DC ("$V_{remote/max-terminate}$") indicating that something has gone wrong with the TRD protocol process or equipment that should result in the termination of the TRD protocol. $V_{remote/max-terminate}$ is set at a level below which the TRD protocol should have been successfully completed in normal course. Meeting or exceeding that level means that a problem is likely to have occurred. If this or another error or irregularity has been encountered, the logic sets appropriate error flag(s) at 44 and returns to the main application at 47. If no error is noted, the protocol 30 proceeds beyond check point 37 and decision point 38 and returns to point 32 to delay briefly while the next higher output voltage of remote power supply 1 "settles."

After the delay time 32 has expired, the current through the conductor loop is monitored 33 to determine the current inflection point. The inflection point corresponds to the event when the voltage received at the TRD module 20 reaches a specified maximum, i.e., trip-voltage $V_{local/max}$, for example 12.7V DC. When $V_{local/max}$ occurs, the switch removes the load that had been placed across the transmission conductors. (See FIG. 8 and the associated description of the TRD circuit.) The opening of the circuit creates an immediate, sharp drop in the current flowing through the transmission circuit. It may also result in a slight temporary perturbation in the voltage. However, the removal of the load does not permanently affect the voltage at the remote end of the transmission loop. (See FIG. 7.) In the embodiment depicted in FIGS. 8 and 9 the "comparison" of $V_{local/n}$ against $V_{local/max}$ and the removal of the load all occur as the result of a hard wired circuit without the intervention of TRD protocol 30 or other computer intelligence. As described later, $V_{local/max}$ is determined in part by selecting the size of the load placed temporarily across the transmission conductors.

To detect this inflection point at the remote power supply, the measured loop current is compared 34 to the previous measured value stored at 35 to determine if the current is significantly less than the previously measured value. For example, a measured current of 50% less than the previous value is a reasonable indication that the inflection point has been reached. If the current is not less than 50% of the previous value, the current measurement is stored 35, and TRD process continues as previously discussed. Again, the loop line voltage is increased by an incremental step 36, for example 600 mV.

It should be noted that during the protocol mode, the line voltage is incremented over a limited range of magnitude to ensure that the voltage stays at a low, safe level until full output power is enabled. Beneficially, the "min" and "max" TRD detection voltages are both lower than the intended operating voltage needed by the local communications device (exclusive of the TRD mechanisms themselves). For example, in a system such as that described in the '314 patent a reasonable voltage range would be 6V DC to 21V DC at the output of the remote power source 11. If an inflection point is not detected within this range, an error is flagged as previously described. If a line error condition is detected 37, as described in FIG. 6, appropriate error flags are set and the protocol mode is terminated 47 and program control returns to the main control application 5. In general, the TRD protocol continues until: (a) the inflection point is reached, and the TR data is obtained; or (b) the line voltage has exceeded $V_{remote/max-terminator}$ (c) the protocol logic detects a line error condition 38; or (d) a line error condition otherwise causes the power supply to shut down, for example, as a result of an over-voltage, over-current or ground fault condition detected by 12.

When the current test conditions are satisfied at 34 indicating that the inflection point has been reached, the protocol ceases to increase the output voltage of the remote power supply 11 and holds it at the inflection point setting so that the voltage can be accurately measured. This is accomplished by measuring the inflection point voltage ("$V_{remote/inflection}$") and storing the value 39 several times (e.g., three or more samples) during a period of time to average the voltage measurement. This is desirable because the output voltage may temporarily "spike" or "dip" following the sudden removal of the load across the conductors 2a and 2b, and it takes some time for the voltage to return to steady state. A precise voltage measurement at the inflection point is helpful in insuring accuracy of the TR data and determinations made from that data. The exact averaging time period is not critical to this process but may be dependent on: the anticipated time needed for stabilization of the voltage after release of the load, the number of samples desired, and the responsiveness of the voltage measurement module 14. During the averaging period, the main logic control continues to check for line errors 37' and terminates the protocol mode and sets appropriate error flags if any errors are detected 44. Line error check 37' can be the same as check 37. After the averaging time period 40 has been completed, the voltage measurements are averaged at 41 based on the number of measurements taken, and the result ($V_{remote/inflection}$) is stored at 45 for further use by the main application 5 in setting the output voltage of power supply 11. As described elsewhere herein, $V_{remote/inflection}$ is used as part of the TR data for the very practical purpose of setting the output voltage of the remote power supply 11 to overcome the resistance of the transmission loop and to drive the local communications device 3.

The averaging process depicted in FIG. 5 is only one way of determining $V_{remote/inflection}$. Other procedures can be employed, such as monitoring the local voltage at 39 in intervals until consecutive measurements are within a limited variance from one another indicating that the then-measured output voltage $V_{remote/inflection}$ has achieved steady state following the temporary perturbations resulting from reaching the inflection point.

At the inflection point, the protocol then knows the TR data, i.e.: (a) the output of the remote power source 11 at the inflection point, i.e., $V_{remote/inflection}$; (b) the corresponding pre-set voltage at the input of the TRD circuit ($V_{local/max}$) which trips the switch and removes the load across the transmission conductors thereby causing the current inflection point; and (c) the current in the transmission circuit immediately prior to the inflection point, i.e., $I_{inflection}$. Items (a) and (c) are measured by 14 and stored in association with the inflection point as determined by the protocol 30. Ordinarily, item (b) is a preset constant programmed into the protocol 30 software or otherwise stored in associated memory.

The protocol mode 30 results in TR data. The protocol mode then returns to the main control application at 47 in FIG. 5. The main control application 5 then utilizes all or part of the TR data to determine the proper voltage of the output for the remote power supply 11. The data can be used, for example, to calculate the transmission line resistance, to calculate the length of the transmission circuit conductors, or to use as input into a "look up" table resulting in an output voltage for the remote power supply. These calculations and the methodology for performing them would be readily known to one of ordinary skill in the art.

For example, to calculate the transmission resistance, the known value of the inflection point voltage at the local device load can be subtracted from the measured output voltage of the remote power source at the inflection point. That voltage drop can be divided by the inflection current. Thus:

$$R_{transmission} = (V_{remote/inflection} - V_{local/max})/I_{inflection}$$

The length of the transmission conductors in the circuit can also be calculated if the nominal per foot resistance of the transmission conductor $R_{conductor\ per\ foot}$ is known. Thus:

Length of the conductors=
$(R_{transmission}/R_{conductor-per-unit-length})$

This method calculates the length of the conductors in situations where the power is transmitted through two conductors. If more than two conductors are used in the power transmission circuit, the calculations must be adjusted appropriately to accommodate the combined resistances.

In another embodiment, all or part of the TR data are used as input to a "look-up" table the result of which is an output voltage for the remote power source 11 necessary to appropriately power the local communications device 3. In one embodiment, the look-up table may be based on empirical data correlating the TRD current and voltage(s) with an optimum output voltage.

In setting the output voltage for the remote power source, the main application 5 may also take into account the power requirements of the local communications device. This may be a preset constant programmed into the protocol 30 software or stored in memory for later identification by the software. Alternatively, there may be software or hardware means to add those power requirements or an approximation thereof onto the power requirements needed to overcome the transmission line resistance. In one embodiment, the variable output power supply can be set to a "low," "medium" or "high" power requirement for the local communications device 3 or other preset ranges for typical power requirements. When the protocol 30 provides an appropriate voltage output for transmission resistance, the power supply adds on the additional voltage needed for operation of the local communications device. In another embodiment, an enhancement factor may be employed to compensate for potential variances in the power requirements of the local communications device. The combination then becomes the normal operating output voltage for the remote power supply until a subsequent use of the TRD protocol provides different TR data leading to a different output voltage.

As indicated in FIG. 5, the TRD protocol checks on several occasions 37 and 37' to see whether there are "line error" conditions that indicate a problem. These are general operational limit checks using functional modules 12 and 14 to make sure, among other things, that there are reasonable voltage and current readings before and during the TRD protocol. In extreme situations of over-voltage, over-current or ground fault conditions, module 14 may immediately shut down the power supply 1 or take other prompt action. In less egregious situations, a line error may pre-empt or terminate the TRD process at 38 or 38'. As noted previously, these line error checks are not necessary for the TRD process to acquire TR data. However, the line error checks serve to ensure that the TRD protocol has been performed uncorrupted by a significant line error condition and that the TR data obtained is not distorted by such a condition. For example, as part of the voltage averaging process at 39 and 40, the line error check called at 37' and 38' helps to ensure the accuracy of the averaging process.

FIG. 6 illustrates the logical flow of events that could occur during one embodiment of the error checks initiated at either 37 or 37' in FIG. 5. In this embodiment, the error check subroutine is the same, regardless of the entry point from TRD protocol 30. In the example shown, the entry point is from 37 in the protocol illustrated in FIG. 5. Initially, the line error check subroutine at 91 "reads" the hardware detectors 12 through a digital logic port to determine if the hardware has detected an over-voltage, over-current, or ground-fault condition on the output conductors. As noted previously, in severe situations of this nature, module 14 may proceed immediately to shut down the power supply 1. If a hardware error condition is detected, 91 sets one or more error flag(s) at 97 to indicate the specific error(s), and the subroutine proceeds to the protocol mode function 44 (via 38) where a flag is set and/or additional corrective action is taken. Then control is returned to the main application 5 via 47 (FIG. 5).

If no hardware errors are detected, the "line error" subroutine proceeds to 92 where it reads module 14 for the transmission loop current and the output voltage of the remote power supply 11. The line error subroutine checks the current reading to see whether it exceeds a high limit at 93 or falls below a low limit at 95. Similarly, the voltage is checked to see whether it exceeds a high limit at 94 or falls below a low limit at 96. In the event that the current or voltage reading falls outside any one or more of these limits, specific error flag(s) will be set at 97. As with other line error situations noted above, the subroutine then proceeds to the protocol mode function at 44 (via 38) where a flag is set and/or corrective action is taken, and control is returned to the main application at 47.

The line error subroutine can take a number of corrective actions at 44 depending on the error flag(s) that have previously been set. For example, if the error is a "critical error" such as over-voltage or over-current, the TRD protocol would be terminated and the transmission loop or channel would be disabled immediately, if module 12 has not already done so. For a "non-critical error," the TRD process could be reset and allowed to repeat in an attempt to complete the acquisition of TR data. Although not depicted in FIG. 6, the error check subroutine can return a result flag to the TRD routine which then checks the flag for True or False indicating if an error condition was detected (e.g., True=error; False=no error).

If no errors are found by the line error check at 91, 93, 94, 95 or 96, the subroutine is completed and returns to the TRD protocol at 38 as depicted in FIG. 5.

Example 1

Figure 7:
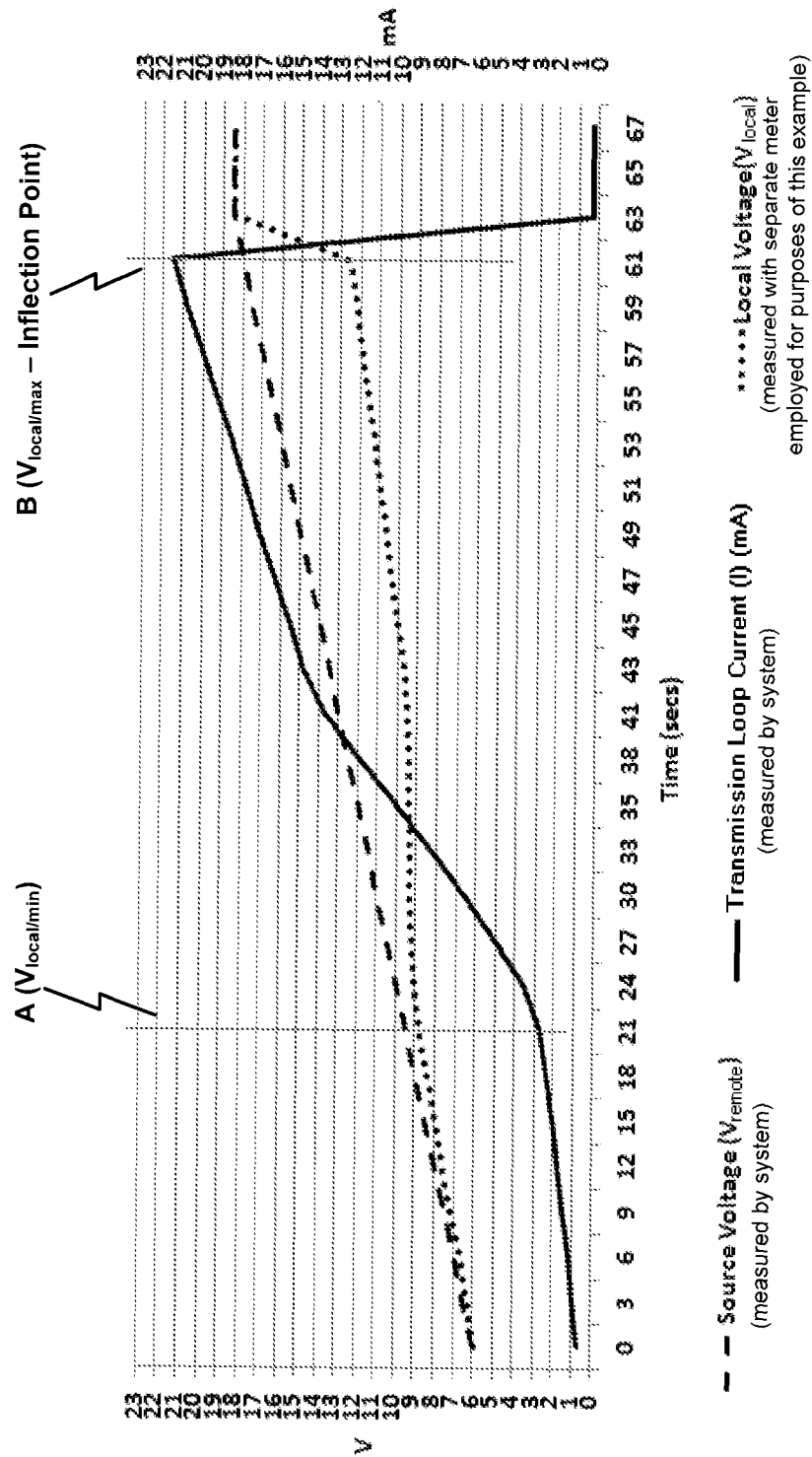
FIG. 7 is a chart illustrating an example of data obtained during a TRD protocol in accordance with one embodiment and showing how increases in the output voltage of the remote power source compare with corresponding voltages received at the TRD module and corresponding current measurements in the transmission conductors as the TRD protocol proceeds.

In considering the TRD methods described previously with respect to FIGS. 4 and 5, it is helpful to understand the current and voltage relationships during the TRD process and the acquisition of TR data. FIG. 7 is a graph depicting an example of the relationships between:
(a) the output voltage of the remote power source ($V_{remote/n}$), represented by the dashed line (- - - -);
(b) the corresponding voltage received at the local TRD circuit ($V_{local/n}$), represented by the dotted line (· · · ·) and
(c) the current flowing through the transmission conductors ($I_n$), represented by the solid line (———).

FIG. 7 shows the voltage and current relationships as they were measured in an actual test during the period of time when the TRD protocol mode was active. (FIG. 5) Although the system architecture was essentially that shown in FIGS. 2, 8 and 9, a voltage measuring device was employed locally at the TRD module 20 for purposes of this test only so that measurements of $V_{local/n}$ could be obtained. Ordinarily, voltage measurements at the TRD circuit would not be necessary and would not be taken, since it is not necessary for the TRD module described herein to have absolute voltage measurements. The hard wired circuit reacts when the preset voltages $V_{local/min}$ and $V_{local/max}$ are received and closes and opens a switch applying a load or removing the load across the conductors in response to those respective events. With the exception of these automatic responses, the TRD circuit itself does not otherwise know the voltage it receives from the remote power source from time-to-time.

For purposes of this test, the TRD module 20 employed the following parameters:
$V_{local/min}$—9V DC (Switch is closed and load is placed across the transmission conductors.)
$V_{local/max}$—12.7V DC (Switch is opened and load is removed from the transmission conductors.)
$V_{remote/max-terminate}$—21.0V DC (TRD protocol is terminated.)

The protocol mode depicted in FIG. 5 was deployed to run the TRD evaluation process during the collection of data shown in FIG. 7. The protocol and TRD process extended over a period of time of approximately 65 seconds or less, as shown on the horizontal axis of FIG. 7. The units on the left vertical axis represent volts DC (for the voltage data, both local and remote) and on the right vertical axis represent milliamps (for the current data). (Note: It is coincidental that the numerical units for the voltage and current measurements during the test fell within the same range, albeit volts and mA, respectively.)

At time equal to 0 seconds in FIG. 7, the TRD protocol mode has set the output voltage of the remote power supply 11 at an initial base voltage of 6 volts ($V_{remote/initial}$). The protocol then incrementally increased the output voltage in steps of about 0.56 volts. This occurred approximately every 3.39 seconds. Although FIG. 7 depicts the output voltage of the remote power source ($V_{remote/n}$) as a smooth line connecting the incremental increases in voltage at their respective peaks, in reality a continuous plot of that voltage would look like a staircase, each step of which increased in amplitude by 0.56 volts over the previous step and each step having a length of about 3.39 seconds. Similarly, the lines for $V_{local/n}$ and $I_n$ in FIG. 7 have also been "smoothed" between data points.

As depicted in FIG. 7, the initial voltage received at the TRD module ($V_{local/initial}$) was nearly the same as ($V_{remote/initial}$). The voltage received at the TRD module ($V_{local/n}$) continues to rise closely with ($V_{remote/n}$) at the outset of the data. This is so, because the inherent current in the transmission circuit is very low, typically less than about 2 mA.

One of the advantages of certain embodiments is that the TRD equipment and protocol do not require the measurement of electrical conditions at the local communications device and do not require the transmission of data representing those conditions from the local communications device to the controller for the remote power supply. This is accomplished, at least in part, by the fact that: (a) $V_{local/min}$ is a pre-set condition, which when reached, results in the automatic application of an additional load across the transmission conductors and (b) $V_{local/max}$ is a pre-set condition that, when reached, results in the automatic release of the load thereby defining the current inflection point. $V_{local/max}$ is a "constant" in the TR data. Accordingly, for purposes of the test which resulted in FIG. 7, the local voltage (i.e., $V_{local}$) was measured with a separate voltmeter added in-line in the TRD module. Ordinarily, such a voltage measurement device would not be required in connection with the TRD module.

When the voltage received at the TRD module reaches $V_{local/min}$ (9 volts), the switch was closed and an additional load of approximately 500 ohms was placed across the transmission conductors 2a and 2b. The conditions at $V_{local/min}$ are identified on FIG. 7 at vertical line A. The placement of the load is illustrated, for example, as item 85 on FIG. 8. As shown in FIG. 7, the addition of the load resulted in a significant increase in the current flowing in the transmission conductors. Also, the voltage received thereafter by the TRD module ($V_{local/n}$) became much less than the output voltage of the remote power supply ($V_{remote/n}$).

The current in the transmission loop is shown as a solid line in FIG. 7 and does not exhibit a linear mode. The initial current $I_{initial}$ was measured at about 0.6 mA and then gently increased until the local voltage reached $V_{local/min}$ (9 volts) where it began a steeper increase because the load had been switched in-circuit at the local device. The current then steadily rose until $V_{local/max}$ (12.7 volts) was reached. The current then fell dramatically back to a very low value of 0.28 mA. This sharp reduction in current, i.e., the "inflection point," was detected by the current detector 14. The conditions at the inflection point are identified in FIG. 7 at vertical line B. When the protocol detected the inflection point, the output voltage from the remote power source ceased to increase and was held at that value by the protocol, so that the output voltage at the remote power source $V_{remote/inflection}$ (18.3 volts) could be accurately measured. After the inflection point was reached, the voltage received at the TRD module rose almost to the same value as the output at the remote power source.

During this example, the following TR data was obtained:
(a) the output voltage of the remote power source at the inflection point ($V_{remote/inflection}$) was measured at: 18.3V DC.
(b) the current flowing through the transmission conductors at the inflection point ($I_{inflection}$) was measured at: 21.5 milliamps.

The corresponding voltage received at the local TRD module ($V_{local/max}$), e.g., 12.7 V DC, was a constant in the TRD protocol. The value of $V_{local/max}$ was governed by the value of resistors 62 and 64, the voltage of Zener diode 63, and the Vbe (i.e., base to emitter voltage) of transistor 65, as identified later in connection with FIG. 9.

From the TR data the total resistance was calculated as: 260 ohms, i.e.:

$$18.3[V_{remote/inflection}]-12.7[V_{local/max}]/21.5 \text{ mA } [I_{inflection}]=260 \text{ ohms}$$

And the length of the transmission conductors was calculated as: 5001 ft., i.e.:

$$260 \text{ ohms}/52 \text{ ohms per } 1000 \text{ feet of the conductor}=5001 \text{ ft}$$

The accuracy of the later calculation can be inferred from the fact that the transmission cable was comprised of five spools of wire each with a nominal length of 1000 feet. Assuming the nominal length was the actual length of the transmission conductors (i.e., 5000 ft.), the TRD detection was accurate within 0.02%.

Figure 8:
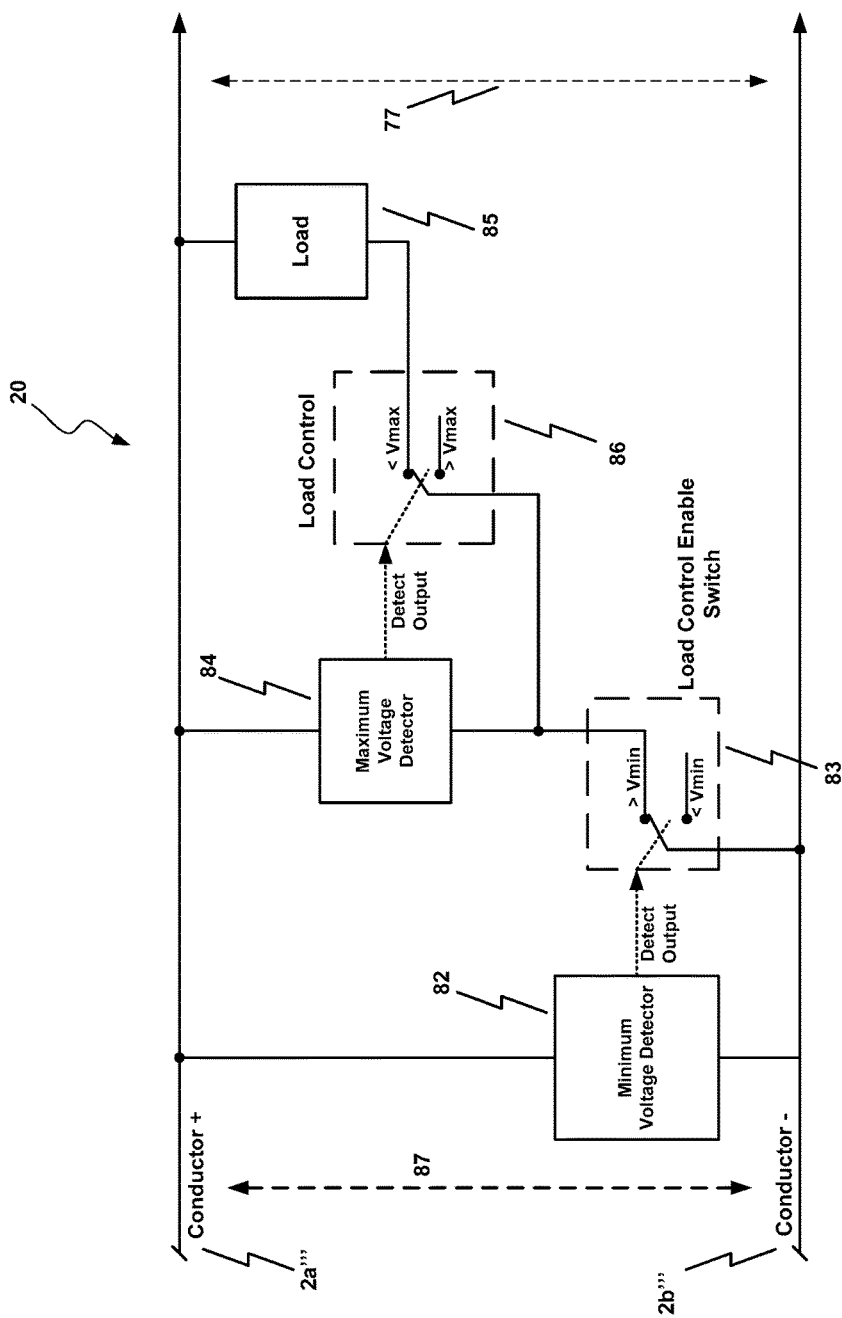
FIG. 8 is a block diagram that depicts one embodiment of functional components of a TRD module located in, at or near a local communications device and the relationship of the components to one another.
Figure 9:
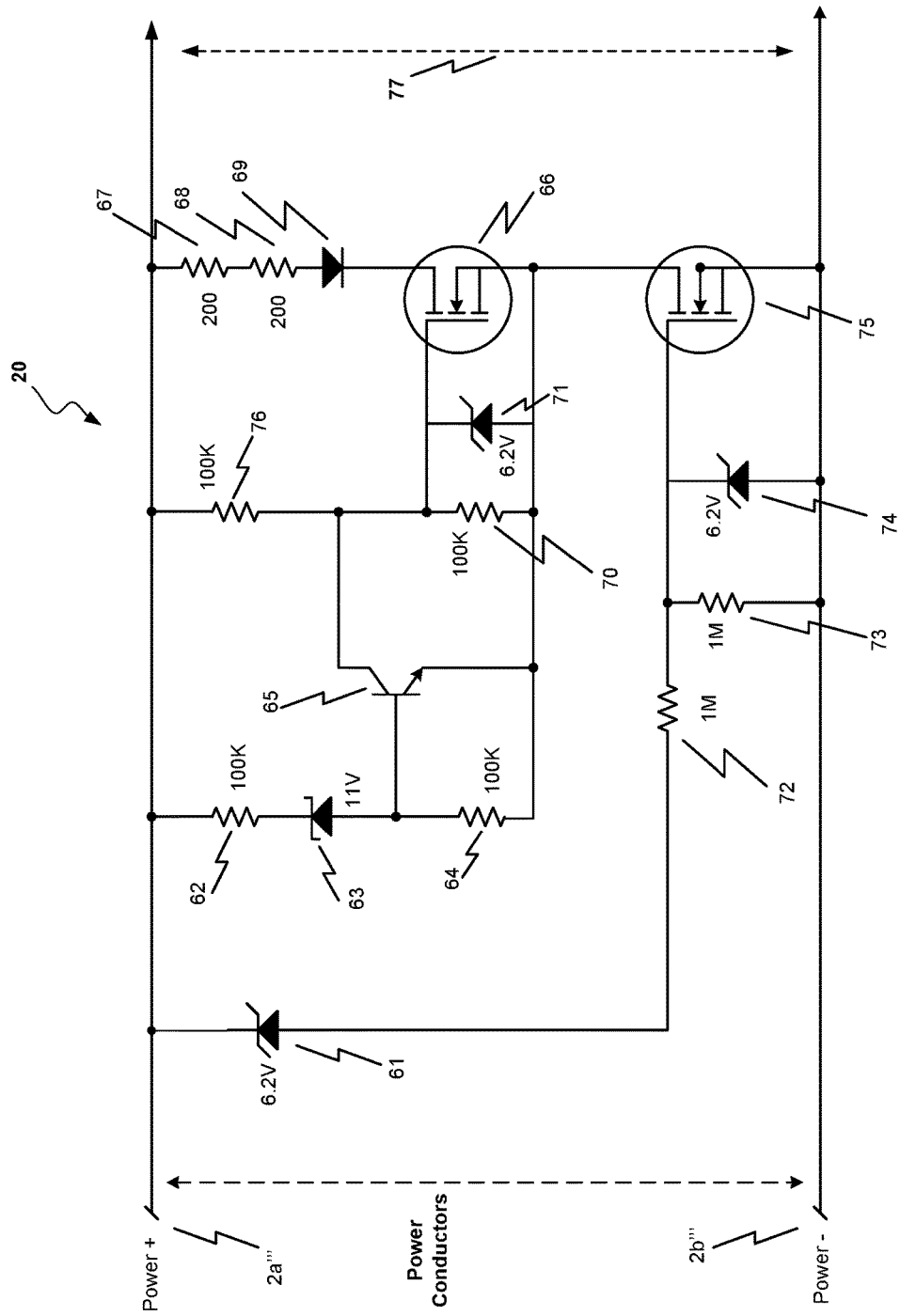
FIG. 9 is a TRD module circuit diagram in accordance with an embodiment for effecting the functionality illustrated more generally in FIG. 8.

An example of a hardware implementation in accordance with one embodiment of the technology is now described with respect to FIGS. 8 and 9. FIG. 8 provides information about a TRD module at a functional level. FIG. 9 illustrates a corresponding electrical circuit that is capable of performing the functions depicted in FIG. 8. The functionality and hardware can be deployed, for example, within the context of the methods and protocol previously described with respect to FIGS. 4, 5 and 6.

FIG. 8 is a functional block diagram of the TRD circuit 20 in the local communications device 3, as those items were generally depicted in FIG. 2. Inputs to the TRD circuit are the power conductors 2a and 2b. As the remote power supply 1 starts up, the main control program 5 begins, and the output ($V_{remote}$) of the remote power supply begins to rise incrementally in response to the TRD protocol and is set at $V_{remote/initial}$. Ordinarily, the initial voltage across 87 received by the TRD circuit at the local premises (i.e. $V_{local/initial}$) is below the threshold of the minimum voltage detector 82 (i.e. $V_{local/min}$). Because the load control switch 83 is open, only minimal, residual current flows in the power conductors 2a and 2b. The TRD circuit is interposed between power conductors 2a and 2b which extend beyond the TRD circuit at 77 to deliver power to the local power supply 18. As noted elsewhere, the local power supply will start when the voltage at 77 is sufficient to meet the threshold to accomplish start-up.

When the line voltage across 87 meets or exceeds the voltage threshold of the minimum voltage detector 82 (i.e. $V_{local/min}$), the output of the minimum voltage detector activates the load control switch 83. When the load control switch closes, the pre-determined load 85 is applied to the power conductors 2a and 2b. This causes a more robust current to flow in the power conductors. This current level is measured by module 14 located in the remote power supply 1.

The TRD circuit 20 continues to function in this operational state as the TRD protocol mode depicted in FIG. 5 incrementally steps-up the voltage applied to the power conductors 2a and 2b. The sequence of output voltages at the remote power source (i.e., $V_{remote/n}$), the voltage received by the local TRD circuit (i.e. $V_{local/n}$), and the current flow through the conductors 2a and 2b are illustrated, for example, in FIG. 7. When the voltage received by the TRD circuit ($V_{local/n}$) meets or exceeds the threshold of the maximum voltage detector 84 ($V_{local/max}$), the output of the detector releases the load control switch 86 (turning it off). This removes the pre-determined load 85 from the power conductors and creates the current inflection point event ($I_{inflection}$). When the TRD protocol of FIG. 5 notes that the current flow measured by 14 has dramatically decreased, the protocol measures the corresponding output voltage ($V_{remote/inflection}$) from the power source. The TR data has then been identified, and it is possible to determine the DC resistance of the power transmission loop. By subtracting, $V_{local/max}$ from $V_{remote/inflection}$ (i.e., the corresponding output voltage of the power supply 1 at the inflection point) the voltage drop across the transmission circuit can be ascertained. Coupled with the known current flow at the inflection point ($I_{inflection}$), the transmission resistance can be calculated. One skilled in the art would know how to use the TR data in various ways to control the output of the remote power source 1.

The $V_{local/max}$ threshold is a selected and known constant that is pre-determined by considering the specific requirements of the transmission system. The desired maximum voltage detection level is then designed into the system by selecting the size and nature of the load 85 and other components in the maximum voltage detect module 84. In one embodiment $V_{local/max}$ is selected to be greater than $V_{local/min}$ and less than the starting voltage of the local power supply 18. This prevents the local power supply from attempting to start during the TRD protocol, an event which would compromise the accuracy of the TR data obtained. In the specific example (Example 2) described below, a $V_{max}$ threshold of 12.7 V was used as a reasonable value for a power conductor input range ($V_{local}$) at the local communications device which receives about 6V to 24V during the operation of the TRD protocol and circuit. In one embodiment ($V_{local/max}$) is pre-stored as a constant and utilized in connection with the TRD protocol of FIG. 5.

FIG. 9 depicts an example of one form of TRD hardware circuitry that provides the functionality shown in FIG. 8. Since all of the components are connected electronically and their interrelationship depends on the status of the TRD process (e.g., the initial process leading up to $V_{local/min}$, the process thereafter leading up, to $V_{local/max}$ and the process following the attainment of $V_{local/max}$), it is not possible to precisely and uniformly identify the components of FIG. 9 corresponding with the functional blocks in FIG. 8. Individual components may be identified as being part of one functional unit as well as others depending on the factors previously mentioned. For example, in FIG. 8, load control enable switch 82 and load control 86 can be the same device or can be interrelated in a number of ways.

Suitable components for one embodiment of the TRD circuit of FIG. 9 are identified in the following Table I.

TABLE I

| Item No. | Key electrical characteristic(s). | Source |
|---|---|---|
| Zener diode 61 | 6.2 volts | Part number MMSZ5234B from On Semiconductor, Phoenix, AZ. |
| Resistor 62 | 100,000 ohm SMD 0603 | Part number RC0603FR-07100KL from Yaego America, San Jose, CA. |
| Zener diode 63 | 11 volts | Part number MMSZ5241BT1G from On Semiconductor, Phoenix, AZ. |
| Resistor 64 | (Same as resistor 62) | (Same as resistor 62) |
| Transistor 65 | High voltage NPN transistor | Part number KST42MFT from Fairchild Semiconductor Corporation, San Jose, CA. |
| MOSFET transistor 66 | High voltage, Low On resistance, N channel transistor | Part number TN2404K from Vishay Americas, Shelton, CT, 06484. |
| Resistor 67 | 200 ohm 1% | Part number CRCW1206200RFKEAHP from Vishay Americas, Shelton, CT, 06484. |
| Resistor 68 | (Same as resistor 67) | (Same as resistor 67) |
| LED 69 | 3.3 V forward voltage | LTST-C191TBKT from Lite-On, Inc., Milpitas, CA 95035. |
| Resistor 70 | (Same as resistor 62) | (Same as resistor 62) |
| Zener diode 71 | 6.2 volts | (Same as Zener diode 61) |
| Resistor 72 | 1.0 Meg ohm SMD 0603 | Part number RC0603FR-071ML from Yaego America, San Jose, CA. |
| Resistor 73 | (Same as resistor 72) | (Same as resistor 72) |
| Zener diode 74 | 6.2 volts | (Same as Zener diode 61) |
| MOSFET transistor 75 | (Same as transistor 66) | (Same as transistor 66) |
| Resistor 76 | (Same as resistor 62) | (Same as resistor 62) |

The operation of these components to perform the appropriate functions is described in the following example.

Example 2

This example details an embodiment of the technology in the context of a telephone system in a penal institution. The challenge of delivering power to a local communications device in the institution is two-fold: (A) to provide optimum power from a remote power source to local communications devices having power requirements in excess of that needed to operate a simple telephone and (B) to do so efficiently using legacy 2-wire conductors inside the prison infrastructure and having an unknown length and resistance. AC power is not readily available in the prison environment. Also, it is expensive and difficult to replace or enhance the existing wiring embedded in the prison building/complex so that more raw power can be supplied.

Problem (A) can be resolved using architecture and methods described in the '314 patent to provide increased power over a pre-existing hard-wired network. Nevertheless, power from the remote power source should be apportioned wisely for efficient operation of the in-house telephone network. That network comprises numerous communications devices in different locations (e.g., "day rooms," offices, control positions, etc.) having separate power distribution channels of unknown length and resistance. These parameters cannot be determined without ripping apart the surrounding structure, creating the very problem and difficulties that would be encountered with installing new communications cable. This example depicts how TRD methods and systems can be deployed to solve problem (B), i.e., identifying the transmission resistance for each transmission channel so that the remote, finite power source can be operated efficiently and effectively.

As depicted in FIGS. 1 and 2, the telecommunications system includes three main components including a remote power supply, a length of conductors, and a local, communications device.

(1) Remote Power Supply:

The bulk power supply used in this example is a custom supply built by Jasper Electronics of Anaheim Calif., Model No. CM421. Such a power supply has an AC input of 120V AC and a DC output of 210V DC. The output of the bulk DC power supply is fed to the inputs of an adjustable voltage output switching power supply, e.g., the SMPS. A suitable power supply for demonstrating the invention could be provided with a programmable linear supply, such as an AMETEK Programmable power model XEL 250-0.37 with option P (for programmable) manufactured by AMETEK Programmable Power, San Diego, Calif. One skilled in the art would know how to program this supply via appropriate software. The controller should include internal volatile RAM and non-volatile FLASH type memories and input/output interfaces, e.g., RS232 or USB, that are compatible with the digital interfaces in the remote power supply. The control logic can vary the output of the variable voltage power supply between 0 and 140 V DC for purposes described herein. The control logic and/or associated memory contains "constants" representing (a) the power requirement of the local communications device and (b) the voltage ($V_{local/max}$) received at the local TRD circuit at or above which the load is removed from across the transmission conductors thereby creating the inflection point.

The remote power supply also includes or is associated with a voltage measuring device and a current measuring device using techniques known to one of ordinary skill in the art. For example, current is determined by measuring the voltage across a sensing resistor connected in series with the power supply output. (Note that FIG. 2, does not directly show that item 14 is connected "in series" with the output of SMPS 11, because it is "buried" inside.) For convenience the resistor (not shown) was selected to be 1 ohm meaning that a reading of 1 volt across the resistor would indicate 1 ampere of current. The voltage across the resistor is obtained differentially using a differential amplifier opamp circuit. In this case the opamp comprises the use of one-half of a dual opamp, e.g., an ISL28207 manufactured by Intersil Corporation, Palm Bay, Fla. This opamp was selected for its low noise, low input offset and low input bias current. The output of the operational amplifier is scaled by an amplifier circuit using the ISL28207 and is then connected to an eight-bit analog to digital convertor, e.g., an ADS7830 manufactured by Texas Instruments, Dallas, Tex. The output is read by the microcontroller to obtain the voltage reading. By knowing the scaling factors of the circuitry, the microcontroller determines the current.

The voltage measurement is accomplished by using a high impedance resistive voltage divider, e.g., the same type of 8 channel opamp noted in the preceding paragraph connected to the power supply output. The high impedance is used to have negligible loading of the power supply and the scaling converts the high voltages to levels compatible with the measurement circuitry. An opamp is used to convert the scaled voltage levels to a single ended output. In this case the opamp is one-half of an ISL28207 manufactured by Intersil Corporation, Palm Bay, Fla. The output of the operational amplifier is then connected to an ADS7830 analog to digital convertor which is read by the microcontroller to obtain the voltage reading. By knowing the scaling factors of the circuitry, the microcontroller determines the voltage.

(2) Transmission Circuit:

The existing transmission conductors are 24AWG twisted-pair copper wires that are common in telephony applications. They convey power from the power supply to the local communications device. However, the conductor length and the existence of other components or conditions of the transmission circuit that might affect the transmission resistance are unknown. As described below, the local communications device requires a communications link to remote resources, e.g., the Internet. This is accomplished by utilizing Ethernet Internet Protocol as a network protocol to transmit the communications data to and from the local communications device. One skilled in the art will recognize that a digital transport layer such as DSL (Digital Subscriber Line) technology can be overlaid onto the power transmission conductors by the remote power supply and the local communications device to provide the communications transport.

(3) Local Communications Device:

In this example, the local communications device is a multi-functional end-user unit that provides the user with access to a variety of digitally presented applications, primarily communication applications such as video calling, voice-only calling, banking functions, administrative form maintenance, medical services, email, and media services such as music, video, news, and other digitally presented applications. The local communications device utilizes a touch panel for receiving input from the user, a Liquid Crystal Display to allow the user to view all visual components of the various applications, a telephone-type handset comprising a speaker and microphone to allow the user to hear and produce audio, and a high-resolution camera for video communication to another party. The regulated power supply associated with the local communications device uses DC power of +/−60V DC to +/−120V DC, to be supplied from the remote power supply over the conductors. That local regulated power supply provides +3.3V DC to +5V DC to components including a telephone plus associated microprocessor(s), memory components, input/output interfaces, DSL modem, and user-interface peripherals. The power requirements of the local communications device are known and, which as mentioned previously, are provided as a "constant" in the controller for the variable output power supply. For example, local communications devices of the type mentioned previously may be in the range of about 5 to about 14 Watts depending on device configuration, e.g., peripherals, etc.

Upon start-up of the power supply, the operational sequence begins with the remote power supply executing the protocol mode to determine the resistance of the conductors between the remote power supply and the local communications device. That process is described more completely below. After the transmission resistance has been determined, the control system will automatically adjust the output power to a level necessary to support the communications device taking into account the transmission resistance. When the optimal operating voltage level has been set, the switching power supply associated with the local communications device will start, and the local communications device will begin operation. The TRD circuit is only operational when the remote power supply is running the protocol mode to determine conductor length and does not operate during normal local device operation.

To obtain TR data, the TRD process and system in this example utilized the protocol shown in FIGS. 4, 5 and 6 as previously described. It also employed the hardware circuit shown functionally in FIG. 8 and in the specific hardware configuration shown in and described with respect to FIG. 9 including the components identified in Table I. It should be noted that during the operation of the TRD protocol and TRD module, a voltage range of 6V DC to 21V DC is normal at the output of the remote power supply and a current range of about 2 mA to 22 mA is reasonable after a load has been placed across the transmission circuit by the TRD circuit. The size of the load needs to be low enough so a detectable current change can be observed at the remote end. For example, if the load were 100K ohms, the current change at the inflection point would be small and difficult to detect using an 8 bit D/A converter due to the range scaling. The TRD circuit described below was designed for a $V_{local/min}$ of 9.2 V DC and a $V_{local/max}$ of 12.7 V DC. In this example, the load employed in the TRD circuit was 400 ohms.

Subject to the qualifications mentioned previously regarding the interrelationship of the components of FIG. 9 with the functional blocks of FIG. 8, the "minimum voltage detector" 82 (FIG. 8) may include Zener diode 61, resistors 72 and 73, and MOSFET transistor 75, with Zener diode 74 protecting transistor 75. They interact as follows:

Zener diode 61 (6.2V) and the voltage divider effected by resistors 72 and resistor 73 establish the gate voltage on MOSFET transistor 75. When the gate voltage is about 1.5 volts, transistor 75 turns on. The drain of 75 is pulled low to the potential of power negative 2b, and the drain voltage is typically within 50 millivolts of power negative. To achieve a gate voltage of 1.5 volts, the power conductor voltage (power positive 2a with respect to power negative 2b) needs to be at least approximately 9.2 volts. 6.2 volts is dropped across Zener diode 61, with 3 volts across the 2 to 1 voltage divider created by resistors 72 and 73. The voltage across resistor 73 (also the gate voltage) is 1.5 volts. Zener diode 74 protects the gate of 75 from voltages exceeding its maximum voltage rating. In this case, the MOSFET used has a maximum gate-to-source voltage rating up to 20V DC. Voltages above the maximum could damage the MOSFET. Zener diode 74 will "clamp" the gate-to-source voltage at 6.2V DC. This voltage is high enough to assure the MOSFET operates properly and still protects the transistor.

When the drain of 75 is low (75 turned on), the node including the emitter of transistor 65, resistor 70, the anode of Zener diode 71, and the source of MOSFET transistor 66 is simultaneously pulled low which is about 50 millivolts above the signal power negative 2b.

Subject to the qualifications mentioned previously regarding the interrelationship of the components of FIG. 9 with the functional blocks of FIG. 8, the "load control circuit" 86 (FIG. 8) may comprise resistor 70, resistor 76, Zener diode 71, and transistor 66. With MOSFET resistor 75 turned on, the 2 to 1 voltage divider created by resistors 70 and 76 produces a gate voltage on transistor 66 that exceeds the turn on threshold voltage of transistor 66 and turns transistor 66 on (e.g., drain of transistor 66 goes low). As described above, it requires 9.2 volts across the power conductors to turn MOSFET transistor 75 on. When transistor 75 turns on the voltage across resistor 70, the gate voltage of transistor 66 is 4.6 volts, which is more than the 1.5 volts needed to turn transistor 66 on. In addition, Zener diode 61 assures that the voltage across the power conductors is at least 6.2 volts higher than necessary to turn transistor 66 on). With transistor 66 turned on, a current path is established through the load 85 (FIG. 8).

Again, subject to the qualifications mentioned previously regarding the interrelationship of the components of FIG. 9 with the functional blocks of FIG. 8, the "load" 85 (FIG. 8) may comprise resistor 67, resistor 68, and LED 69. They serve to provide a known load across the power conductors 2a and 2b. In this instance the load is about 500 ohms. The current in the power conductors flows through resistors 67 and 68, LED 69, and MOSFET transistors 66 and 75. Zener diode 71 protects the gate 66 from voltages exceeding its maximum voltage rating. One skilled in the art will recognize that resistors 67 and 68 could be replaced with a single resistor with an appropriate resistance and power rating, for example, 400 ohms ½ watt.

Finally, subject to the qualifications mentioned previously regarding the interrelationship of the components of FIG. 9 with the functional blocks of FIG. 8, as the "maximum voltage detector" 84 (FIG. 8) may include resistor 64, resistor 62, Zener diode 63, and transistor 65. To one skilled in the art Zener diode 63 could be replaced with other components that have very sharp turn-on/turn-off characteristics, such as a blue LED, and other components to create an equivalent turn-on voltage as Zener diode 63. This could enhance the operation of the circuit by producing an even more distinct response. As depicted, resistor 62, Zener diode 63 and resistor 64 determine the base voltage on transistor 65. Zener diode 63 (11 V in this example) assures the voltage between the power conductors item 2a and item 2b must be greater than 11V before transistor 65 is turned on. The voltage across resistor 64 is, for example, 0.7 volts when transistor 65 turns on. The voltage across resistor 62 will also be 0.7 volts, since resistor 62 and resistor 64 are the same value. Therefore transistor 65 will not turn on until the communication line voltage at least 0.7+11.0+0.7 or 12.7 volts. In addition, the base current of transistor 65 required to assure the collector of transistor 65 is low must be considered. This current also flows through resistor 62 and requires $V_{local/n}$ to be another 0.3 volts higher. This makes $V_{local/max}$ to be a value of 12.7 volts, i.e., the inflection voltage. When transistor 65 turns on, the collector of transistor 65 is pulled low, which reduces the gate voltage on transistor 66 below the turn-on threshold voltage of transistor 66 thus turning transistor 66 off. When transistor 66 turns off, the current flow through the load resistors 67 and 68 and stops and produces a detectable change (e.g. inflection point) in the current in the power conductors. The electrical characteristics of LED 69 are used to enhance the distinction of current flowing or not flowing, but LED 69 is not essential for the determination of the transmission resistance. One skilled in the art will note the circuit will still function if LED 69 were removed and resistor 68 connected directly to the drain of transistor 66. For power conductor voltages exceeding the $V_{local/max}$ threshold (12.7 volts in this example), no current flows through the resistors 67 and 68, since it has been disconnected from the power conductors.

Since the maximum power conductor voltage in this embodiment is expected to be 140 V DC, due in part to limitations on the remote power source, transistors 65, 66 and 75 were selected with "breakdown" voltages of at least 200 V DC. If the power conductor voltage is higher, transistors with higher breakdown voltage ratings may be required. Similarly, if the power conductor voltage is lower, transistors with appropriate breakdown voltage ratings may be used.

Although bipolar transistors could be used for MOSFET resistors 66 and 75, a MOSFET was selected since it is a voltage controlled device rather than a current controlled device and eliminates additional current in the power transmission circuit when the circuit is operational. Additionally, the MOSFET has an "on" resistance that is low enough to minimize voltage drops at the current levels used while determining the length of the power conductors.

One skilled in the art would recognize that the circuit in the TRD module that determines when to connect (i.e., apply) the load to the line (T/R) at a minimum voltage, functions as a voltage detector with the threshold voltage set appropriately. Similarly, the circuitry in the TRD module that determines when to disconnect/remove the load from the line (T/R) at a higher voltage, also acts as a voltage detector with the threshold voltage set appropriately at a higher voltage. In one embodiment, this is accomplished using transistors and Zener diodes where the electrical characteristics and circuit topology of these components are connected to adjust the threshold voltages to the minimum and maximum values. One skilled in the art will note there are other methods and techniques that could be used to implement the voltage detector functionality The description and drawings herein are intended to identify some embodiments of methods and systems in accordance with the present application and are not intended to limit the full extent of applications and embodiments thereof.

For example, although this application references the use of embodiments in connection with systems and methods described in the '314 patent, it is not limited to such use. Nor is it limited to systems with a local telephone or other communications device. Indeed, embodiments may be deployed in any situation where a remote power source supplies power over some distance to a remote electrical load. One skilled in the art would appreciate that methods and systems in accordance with the present technology could be used and would be useful in applications with satellite TV systems (circuitry located in the LNB), outdoor lighting systems or monitoring cameras, or any other application where the power load is located a long distance (over 100 feet for example) from the power source. In each of these situations, embodiments of the invention can be used to determine the transmission resistance and to set the output voltage of the power source so that sufficient power is delivered to the local load.

Also, methods and systems employing the technology can be used with many conductor types including, for example, coaxial cable, shielded or unshielded twisted pair communication cable such as Cat 3 or Cat 5, SPT (Stranded Parallel Thermoplastic) wire, such as lamp cord, and ribbon cable. Conductors can be constructed of any type of electrically conductive material and may use any diameter (American Wire Gauge) that is suitable for conducting necessary current and voltage requirements of the particular electrical application.

Embodiments described herein utilize current measuring equipment at the remote power supply location, e.g., item 14 in FIG. 2. However, other embodiments of the present invention could deploy the current measuring equipment at the local end of the transmission loop. Such configurations may not be preferred, since the current measuring equipment would add to the power that needs to be transported over the transmission conductors. Also, such configurations could require that data from the current measurements at the local end be transmitted back to the controller at the remote location, further adding complexity to the system.

Alternatively, one could utilize one or more portable devices that contain equipment necessary to practice embodiments of the technology and could be attached temporarily (e.g., as a "test set") or permanently at the appropriate place to the local and/or remote locations. For example, a package containing the TRD module 20 could be attached to the conductors in or at the local communications device 3. And a portable package containing voltage and current measuring devices such as those in module 14 could be attached to the conductors at the remote power supply 11 or in connection with the local communications device 3. That package could also contain appropriate processing and/or transmission equipment to communicate results to main power supply controller 15. The two packages, i.e., the one containing the TRD module and that containing the measuring equipment (plus any processing or communication capability) could be combined into a single package for attachment in or at the local communications device 3. The TR data could then be obtained. The use of a temporary test set could be useful, for example, when a local communications device is initially connected to a remote power supply.

Also, as described herein, embodiments of the present invention incrementally step-up the voltage at the remote power source until the voltage received by the TRD module 20 reaches $V_{local/min}$ and then $V_{local/max}$, rather than starting directly at either of those values. By starting at a lower voltage, the system is able to observe events such as excessive current, no current, reversed conductors, etc. at a low power. Increasing from a lower voltage also increases the accuracy of the inflection detection by allowing 'settling' time at the voltage steps. And a gradual increase in $V_{remote}$ is useful to charge the capacitors in the local power supply. Nevertheless, giving attention to these concerns including the size and nature of the temporary load in module 20, it could be possible that $V_{remote/initial}$ could just go to a final voltage.

Rather than stepping-up the voltage of the remote power source in a series of discrete increases, the output voltage of the remote power source could be increased in a gradual, linear progression. In such an instance, current measurements at 14 could be performed on a periodic basis (e.g., by time interval) until the inflection point is detected. The TRD protocol would otherwise remain the same as previously described.

While the basic operations of the TRD module have been described herein, the module may contain other features that would facilitate its operation and use. For example, circuitry could be added or altered so that the $V_{local/min}$ detector is disabled after the remote communication device becomes operational. This could prevent any possible drain by the TRD module on the power received by the local communication device after that device has started. Similarly, in certain embodiments circuitry could be added or altered, so that the load applied by the TRD module is clearly removed before the remote power source starts up. Inadvertent application of that load at the outset could obviate the operation of the TRD module. In other instances, a load may be applied without requiring a particular minimum voltage.

With respect to the TRD protocol, responsibilities for certain process steps can be apportioned in various ways other than those specifically described herein among the main application controller 5 in FIG. 4, the TRD protocol 6 of FIG. 5 and/or the line error check subroutine in FIG. 6. For example, the TR data can be evaluated for purposes of setting the output voltage of the remote supply either in the main application controller 5 or at the end of TRD protocol 6. Similarly, error flags can be set either by the line error subroutine in FIG. 6 or by the TRD protocol of FIG. 5.

As described in embodiments herein, the TR data may be used, among other things, for controlling the output of a remote power supply. In other embodiments, the TR data may be used for other purposes and at other locations. For example, the TR data may be useful in the installation, maintenance and/or repair of the local communications device or other equipment located in the transmission path.

Also, methods and systems of the technology could be applied to power transmission systems employing AC current. For example, one skilled in the art could implement the system of FIG. 8 in connection with an AC power system using rectifiers, synchronous rectifiers, etc., and current and voltage measuring devices suitable for AC. Alternatively, an AC system could have a separate DC TR data collection system, the results of which would be used by the AC system in operation.

We claim:

1. A method for evaluating the transmission resistance associated with an electrical transmission circuit that conveys power via multiple conductors from a remote power source to a local communications device by collecting transmission resistance data, comprising:
    applying a load across at least two of the conductors in the transmission circuit;
    incrementally increasing the output voltage of the remote power source;
    removing the load from across the conductors when a maximum voltage has been received in, at or near the local communications device thereby defining an inflection point in the current flowing through the transmission circuit; and
    detecting or noting the following transmission resistance data: (a) the output voltage of the remote power source at the inflection point; (b) the maximum voltage at which the inflection point is created by removing the load from the conductors; and (c) the current flowing through the conductors immediately prior to the inflection point.

2. The method of claim 1 wherein the applying of a load occurs when a predetermined minimum voltage has been received in, at or near the local communications device.

3. The method of claim 2 wherein the applying of the load occurs in, at or near the local communications device.

4. The method of claim 2 wherein the minimum and maximum voltages are predetermined threshold voltages that are less than that required to initiate operation of the local communications device.

5. The method of claim 1 further comprising processing all or part of the transmission resistance data by at least one process selected from the group of: (a) calculating the transmission resistance; (b) calculating the length of the multiple conductors; or (c) inputting all or part of the transmission resistance data into a "look up" table or data hierarchy whose output reflects the transmission resistance or line length.

6. A system for evaluating the transmission resistance associated with the transmission of electrical power through multiple conductors from a remote power source to a local communications device, comprising:
    a controller for controlling the voltage output of the remote power source and for incrementally increasing the voltage output of the remote power source during a transmission resistance detection protocol;
    a transmission resistance detection module attached to the multiple conductors at or near the local communications device comprising:
        a known load placed across at least two of the multiple conductors;
        a switch for removing the known load from across the multiple conductors; and a voltage detection circuit for detecting a predetermined maximum voltage received by the transmission resistance detection module and for activating the switch to remove the known load from across the multiple conductors when the maximum voltage has been received;

a current measuring device to measure the current flowing in the transmission conductors;

a voltage measuring device to detect the output voltage of the remote power supply when the maximum voltage is received by the resistance detection circuit; and memory associated with the controller to store, among other things, transmission resistance data for use by the controller in establishing an operational voltage for the remote power source, such transmission resistance data comprising: (a) the predetermined maximum voltage to be received by the transmission resistance detection module; (b) the current flowing through the transmission conductors immediately prior to receipt of the predetermined maximum voltage by the transmission resistance detection module; and (c) the output voltage of the remote power source corresponding to receipt of the predetermined maximum voltage by the transmission resistance detection module.

7. The system of claim 6 wherein the transmission resistance detection module also includes a second voltage detection circuit for detecting a predetermined minimum voltage received by the second detection circuit and for activating a switch to place the known load across the multiple conductors when the minimum voltage has been received.

8. The system of claim 7 wherein the current measuring device is located at or near the remote power source.

9. The system of claim 8 wherein the predetermined minimum and maximum voltages are voltages that are less than that required to initiate operation of the local communications device.

10. The system of claim 8 wherein the remote power source is a variable voltage DC electrical power source.

11. The system of claim 10 wherein at least one of the voltage detection circuit and the second voltage detection circuit comprises at least one transistor and at least one Zener diode where the electrical characteristics and circuit topology of the transistor and diode are connected to establish the predetermined voltage for that circuit.

12. A system for optimizing the transmission of power through multiple conductors from a remote power source to a local communications device, comprising:

a controller for controlling the voltage output of the remote power source and for incrementally increasing the voltage output of the remote power source during a transmission resistance detection protocol and thereafter for taking transmission resistance data obtained by the protocol and using at least a portion of the data to control the output of the remote power source thereafter;

a transmission resistance detection module attached to the multiple conductors at or near the local communications device comprising:

a first voltage detection circuit for detecting a predetermined minimum voltage received by the detection circuit and for placing a known load across at least two of the multiple conductors when the predetermined minimum voltage has been received; and a second voltage detection circuit for detecting a predetermined maximum voltage received by the detection current and for removing the known load from across the multiple conductors when the maximum voltage has been received;

a current measuring device to measure the current flowing in the transmission conductors when the known load has been placed across the multiple conductors;

a voltage measuring device to measure the output voltage of the remote power supply when the maximum voltage is received by the second voltage detection circuit; and memory associated with the controller to store, among other things, transmission resistance data for use by the controller in establish an operational voltage of the remote power source, such transmission resistance data comprising: (a) the predetermined maximum voltage to be received by the second voltage detection circuit; (b) the current flowing through the transmission conductors immediately prior to receipt of the predetermined maximum voltage by the second voltage detection circuit; and (c) the output voltage of the remote power source corresponding to receipt of the predetermined maximum voltage by the second voltage detection module.

13. The system of claim 12 wherein the current measuring device is located at or near the remote power source.

14. The system of claim 13 wherein the predetermined minimum and maximum voltages are voltages that are less than that required to initiate operation of the local communications device.

15. The system of claim 12 wherein the remote power source is a variable voltage DC electrical power source.

16. The system of claim 15 wherein at least one of the first voltage detection circuit and the second voltage detection circuit comprises at least one transistor and at least one Zener diode where the electrical characteristics and circuit topology of the transistor and diode are connected to establish the predetermined voltage.

17. The method of claim 1 wherein the incrementally increasing of the output voltage of the remote power source occurs in a series of discreet step-ups.

18. The method of claim 1 further including automatically initiating the method when the remote power supply is booted or re-booted.

19. The method of claim 1 wherein the detecting or noting of the current flowing through the conductors immediately prior to the inflection point is implemented by detecting the current at or near the location of the remote power source.

20. The method of claim 1 wherein the removing of the load from across the conductors when a maximum voltage has been received is confirmed by determining that the current flowing through the conductors is a predetermined amount less than the current before the maximum voltage was received.

* * * * *